(12) United States Patent
Kasahara

(10) Patent No.: US 7,138,657 B2
(45) Date of Patent: Nov. 21, 2006

(54) SEMICONDUCTOR DEVICE HAVING TWO INSULATING FILMS PROVIDED OVER A SUBSTRATE

(75) Inventor: Kenji Kasahara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/699,668

(22) Filed: Nov. 4, 2003

(65) Prior Publication Data
US 2004/0094767 A1    May 20, 2004

Related U.S. Application Data

(62) Division of application No. 09/406,793, filed on Sep. 28, 1999, now Pat. No. 6,656,779.

(30) Foreign Application Priority Data

Oct. 6, 1998    (JP)    ................................. 10-283711

(51) Int. Cl.
*H01L 27/12* (2006.01)
*H01L 29/786* (2006.01)

(52) U.S. Cl. ......................................... 257/66; 257/72

(58) Field of Classification Search .................. 257/66, 257/69, 72, 288; 438/149, 151, 166
See application file for complete search history.

(56) References Cited

U.S. PATENT DOCUMENTS

| | | | |
|---|---|---|---|
| 4,918,504 A | 4/1990 | Kato et al. | |
| 4,951,601 A | 8/1990 | Maydan et al. | |
| 5,047,360 A * | 9/1991 | Nicholas | ..................... 438/158 |
| 5,130,264 A | 7/1992 | Troxell et al. | |
| 5,147,826 A | 9/1992 | Liu et al. | |
| 5,198,377 A | 3/1993 | Kato et al. | |
| 5,317,433 A | 5/1994 | Miyawaki et al. | |
| 5,583,369 A | 12/1996 | Yamazaki et al. | |
| 5,633,182 A | 5/1997 | Miyawaki et al. | |
| 5,696,386 A | 12/1997 | Yamazaki | |
| 5,773,331 A | 6/1998 | Solomon et al. | |
| 5,821,559 A * | 10/1998 | Yamazaki et al. | ............ 257/57 |
| 5,834,797 A | 11/1998 | Yamanaka | |
| 5,888,858 A | 3/1999 | Yamazaki et al. | |
| 5,894,151 A * | 4/1999 | Yamazaki et al. | .......... 257/347 |
| 5,923,963 A | 7/1999 | Yamanaka | |
| 5,946,561 A | 8/1999 | Yamazaki et al. | |
| 5,985,740 A | 11/1999 | Yamazaki et al. | |
| 6,004,831 A | 12/1999 | Yamazaki et al. | |
| 6,100,954 A * | 8/2000 | Kim et al. | .................. 349/138 |

(Continued)

FOREIGN PATENT DOCUMENTS

EP    0485233 A2 *    5/1992

(Continued)

OTHER PUBLICATIONS

J.H Lan et al., Planarized Copper Gate Hydrogenated Amorphous-Silicon Thin-Film Transistors for AM-LCDs. Device Research Conference Digest, 1998. 56th Annual, pp. 130-131.*

(Continued)

*Primary Examiner*—Anh Duy Mai
(74) *Attorney, Agent, or Firm*—Nixon Peabody LLP; Jeffrey L. Costellia

(57) ABSTRACT

A semiconductor device comprises a first insulating film provided over a substrate and heat-treated, a second insulating film provided over the first insulating film, and a semiconductor film provided over the second insulating film, the second insulating film and the semiconductor film being formed successively without exposing them to the atmosphere.

33 Claims, 17 Drawing Sheets

FORMATION OF SOURCE REGION AND DRAIN REGION

U.S. PATENT DOCUMENTS

| | | | |
|---|---|---|---|
| 6,150,241 | A | 11/2000 | Deleonibus |
| 6,177,302 | B1 | 1/2001 | Yamazaki et al. |
| 6,261,877 | B1 | 7/2001 | Yamazaki et al. |
| 2002/0006705 | A1* | 1/2002 | Suzawa et al. ............. 438/279 |
| 2004/0175873 | A1* | 9/2004 | Yamazaki et al. .......... 438/164 |

FOREIGN PATENT DOCUMENTS

| | | | |
|---|---|---|---|
| EP | 0 545 694 A2 | | 6/1993 |
| EP | 0 862 201 A2 | | 9/1998 |
| JP | 63-31108 | | 2/1988 |
| JP | 06-296023 | * | 10/1994 |
| JP | 8-330602 | | 12/1996 |
| JP | 9-116156 | | 5/1997 |
| JP | 9-148582 | | 6/1997 |
| JP | 9-312260 | | 12/1997 |

OTHER PUBLICATIONS

S.H Won et al., Hdrogenated Amorphous Silicon Thin-Film Transistor on Plastic With an Organic Gate Insulator. IEEE 2004, pp. 132-134.*

U.S. Appl. No. 08/223,823, filed Apr. 6, 1994; "Thin Film Transistors Having Anodized Metal Films Between the Gate Wiring and Drain Wiring" Shunpei Yamazaki et al.

"Dictionary of Scientific and Technical Terms," McGraw-Hill, Inc., Fifth Edition, 1994, p. 541.

* cited by examiner

FORMATION OF FIRST BASE FILM 101a

HEAT-TREATING OF FIRST BASE FILM 101a

SUCCESSIVE FORMATION OF SECOND BASE FILM 101b
AND SEMICONDUCTOR FILM 102

CRYSTALLIZATION OF SEMICONDUCTOR FILM 102

FORMATION OF ACTIVE LAYER (PATTERNING OF SEMICONDUCTOR FILM 102')

FORMATION OF INSULATING FILM 104 AND CONDUCTIVE FILM 105

FORMATION OF GATE LINE 107 AND GATE INSULATING LAYER 106

FORMATION OF SOURCE REGION AND DRAIN REGION

FORMATION OF INTERLAYER INSULATING FILM 115 AND WIRE

FIG. 3
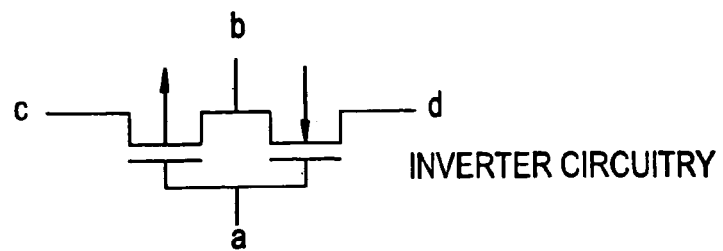
INVERTER CIRCUITRY
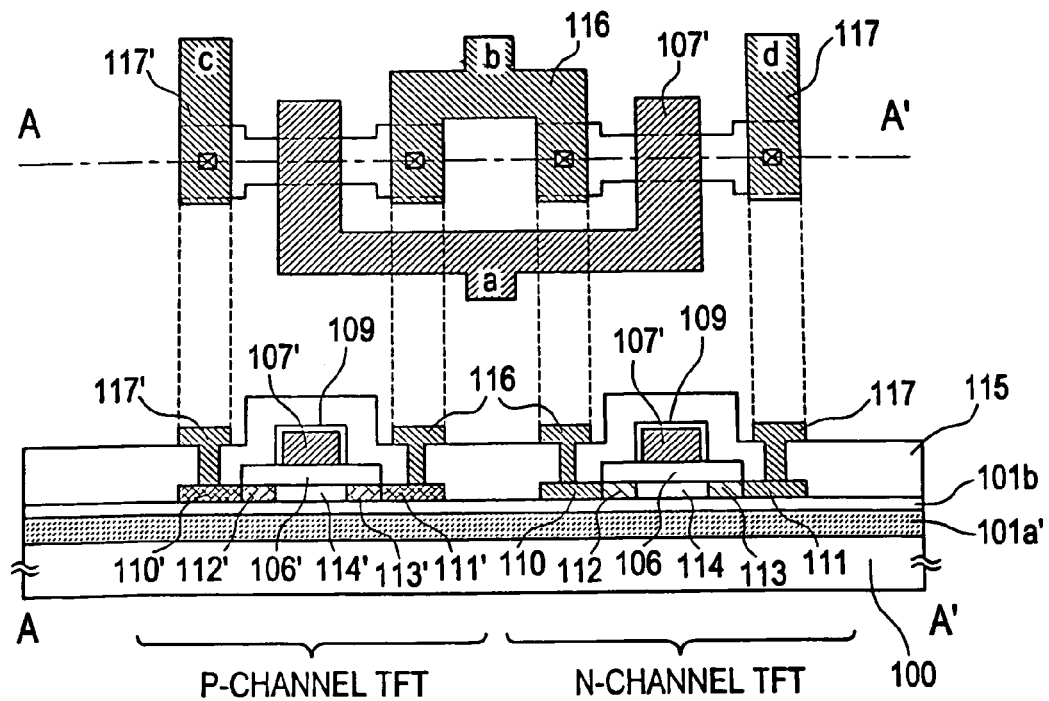

ACTIVE MATRIX SUBSTRATE

SEMICONDUCTOR DEVICE HAVING TWO INSULATING FILMS PROVIDED OVER A SUBSTRATE

BACKGROUND OF THE INVENTION

The present invention relates to a structure of a semiconductor apparatus having semiconductor circuits made of semiconductor devices such as insulated gate transistors, and also to a method of manufacture thereof. Particularly, the invention relates to a technology that forms a crystalline semiconductor film over an insulating surface. The semiconductor apparatus include not only semiconductor devices such as thin-film transistors (TFTs) and MOS transistors but also displays and electrooptic apparatus, such as image sensors, both of which have semiconductor circuits made of insulated gate transistors. In addition, the semiconductor apparatus of this invention also include electronic apparatus incorporating these displays and electrooptic apparatus.

An active matrix liquid crystal display, which forms a pixel matrix circuit and a drive circuit by using thin-film transistors (TFTs) formed on an insulating substrate, is attracting attention. A liquid crystal display currently used as a monitor has a size range of 0.5–20 inches.

TFTs that use as an active layer a crystalline semiconductor film represented by polysilicon are being spotlighted as a means for realizing the liquid crystal display capable of displaying finely defined images. Although TFTs using a crystalline semiconductor film as an active layer have a faster operating speed and a higher driving capability than those TFTs that use an amorphous semiconductor film as an active layer, their TFT characteristics are difficult to control.

One of the causes for the difficulty in controlling the TFT characteristics is the property of an interface between the active layer and the insulating film. This interface, when contaminated, makes it difficult to manufacture the semiconductor devices with good controllability of the TFT characteristics. It is therefore important to clean the interface between the active layer and the insulating film.

Currently, there are growing demands on the TFTs for high mobility and it is considered more promising to use a crystalline semiconductor film with high mobility than to use an amorphous semiconductor film as the TFT's active layer. The method of manufacturing a conventional top gate type TFT using a crystalline semiconductor film will be briefly explained.

First, a substrate having an insulating surface is formed with a base insulating film (hereinafter referred to as a base film) and then heat-treated, after which it is deposited with an amorphous silicon film. Next, the amorphous silicon film is subjected to crystallization processing such as heating and laser beam irradiation to form a polysilicon film (polycrystalline silicon film). Next, the polysilicon film is patterned to a desired shape and deposited with an insulating film (gate insulating layer) and a conductive film (gate line forming material layer). Then these films are patterned to form gate lines. Next, impurities of p- or n-type conductivity are selectively introduced into the polysilicon film to form impurity regions, such as source and drain regions. This is followed by depositing an interlayer insulating film, forming contact holes to expose the source and drain regions, forming a metal film, and then patterning the metal film to form metal lines in contact with the source and drain regions. In this way, the process of manufacturing the TFTs is completed.

In the conventional technology described above, when the base film after being formed is subjected to the heat treatment to improve the TFT reliability, the surface of the base film is exposed to the atmosphere. At this time, the base film surface is contaminated with impurities contained in the air (boron, oxygen, water, sodium, etc.). If a semiconductor film that constitutes an active layer is formed over and in contact with the base film contaminated by the open air, the characteristic of an interface between the active layer, particularly a channel forming region, and the base film deteriorates, leading to a degradation in the electrical characteristic of TFTs.

Because the air in the clean room contains boron from a HEPA filter generally used for cleaning, an unspecified amount of boron mixes into the surface of the film exposed to the atmosphere. The HEPA filter is made of a mesh of glass used to remove minute particles in the air. The glass contains a large amount of boron to make it easy to manufacture the mesh-like structure. Using other filters than the HEPA filter is disadvantageous from the standpoint of reducing the manufacturing cost.

To investigate the effect of the impurities in the air, the insulating base film after being formed is exposed to the atmosphere and then deposited with a laminated structure of semiconductor films made of amorphous silicon films to form TFTs. The SIMS analysis on the manufactured TFTs revealed a concentration peak of boron whose maximum value was $3 \times 10^{17}$ atoms/cm$^3$. When boron mixes into the active layer of semiconductor film, it is diffused and activated by the processes that follow (heat treatment and laser beam processing, etc.) making the control of the impurity concentrations in the active layer difficult. Measurement of the TFT electric characteristic revealed a phenomenon in which the threshold voltage shifts to the plus side.

When impurities (boron, oxygen, water, sodium, etc.) enter into the active layer of semiconductor film, it is found that the crystallization of the semiconductor film is hindered.

The present invention provides a semiconductor apparatus having semiconductor circuits made of semiconductor devices which improve the interface between an active layer, particularly a channel forming region, and a base film to improve the TFT characteristic (such as threshold voltage) and which have high reliability. The invention also provides a method of manufacturing such semiconductor apparatus.

SUMMARY OF THE INVENTION

To achieve the above objectives, this invention is characterized in that the first base film, after it has been formed, is heat-treated and then the second base film (an insulating film having a thickness smaller than that of the first base film) and the semiconductor film are successively formed in laminated layers without being exposed to the atmosphere. This arrangement prevents the active layer, particularly the interface between the channel forming region and the second base film, from being contaminated, thus realizing stable and good electrical characteristics.

A first aspect of the invention disclosed in this specification is a semiconductor apparatus having a semiconductor circuit made of semiconductor devices, which semiconductor apparatus comprises: a first insulating film formed on a substrate; a second insulating film in contact with the first insulating film; a channel forming region and source and drain regions formed on both sides of the channel forming region, the channel forming region and the source and drain regions being formed in contact with the second insulating film and; a gate insulating layer in contact with the channel forming region; and a gate line provided over the channel forming region with the gate insulating layer interposed therebetween; wherein the second insulating film is thinner than the first insulating film.

In this configuration, an impurity concentration in an interface between the first insulating film and the second insulating film is higher than an impurity concentration in an interface between the second insulating film and the channel forming region.

Further, in the above configuration, the second insulating film and the channel forming region are formed by at least a step of successively forming them in laminated layers without exposing them to the atmosphere.

Further, in the above configuration, the first insulating film is formed by at least a heat treatment step.

Further, in the above configuration, the first insulating film has a thickness of 100–500 nm.

Further, in the above configuration, the second insulating film has a thickness of 10–100 nm.

Further, in the above configuration, the second insulating film is a single-layer film of selected one of silicon nitride film, silicon oxynitride film and silicon oxide film, or a laminated film of these films.

Further, in the above configuration, a low concentration impurity region is provided at least between the channel forming region and the source region or between the channel forming region and the drain region.

Further, in the above configuration, a catalytic element that accelerates crystallization of silicon is contained in at least the source region and the drain region.

Further, the catalytic element is at least one or more elements selected from Ni, Fe, Co, Pt, Cu, Au and Ge.

In this specification, the "amorphous semiconductor film" denotes typically a semiconductor film having an amorphous material, such as amorphous semiconductor film having microcrystals and microcrystalline semiconductor film. These semiconductor films are formed of Si film, Ge film or a compound semiconductor film [for example, amorphous silicon germanium film expressed by $Si_XGe_{1-X}$ (0<X<1)]. The semiconductor film can be formed by a known technology, such as reduced pressure thermal CVD method, thermal CVD method and PCVD method.

In this specification, the "crystalline semiconductor film" denotes a single-crystal semiconductor film and a semiconductor film containing grain boundary (including polysilicon semiconductor film and microcrystalline semiconductor film). It is clearly distinguished from a semiconductor film which is amorphous in its entire area (amorphous semiconductor film). It is needless to say that in this specification the word "semiconductor film", of course, includes an amorphous semiconductor film as well as a crystalline semiconductor film.

Further, in this specification the "semiconductor device" denotes a switching device and a memory element, such as a thin-film transistor (TFT) and a thin-film diode (TFD).

A first method of manufacturing a semiconductor apparatus according to this invention is a method of manufacturing a semiconductor apparatus having a semiconductor circuit made of semiconductor devices, which comprises the steps of: forming a first insulating film over a substrate; heat-treating the first insulating film; successively forming over the first insulating film a second insulating film and a semiconductor film in laminated layers without exposing them to the atmosphere; and crystallizing the semiconductor film to form a crystalline semiconductor film.

A second method of manufacturing a semiconductor apparatus according to this invention is a method of manufacturing a semiconductor apparatus having a semiconductor circuit made of semiconductor devices, which comprises the steps of: forming a first insulating film over a substrate; heat-treating the first insulating film; successively forming over the first insulating film a second insulating film and a semiconductor film in laminated layers without exposing them to the atmosphere; introducing into at least a part of the semiconductor film a catalytic element for accelerating crystallization; and crystallizing the semiconductor film to form a crystalline semiconductor film.

A third method of manufacturing a semiconductor apparatus according to this invention is a method of manufacturing a semiconductor apparatus having a semiconductor circuit made of semiconductor devices, which comprises the steps of: forming a first insulating film over a substrate; heat-treating the first insulating film; successively forming over the first insulating film a second insulating film and a semiconductor film in laminated layers without exposing them to the atmosphere; introducing into at least a part of the semiconductor film a catalytic element for accelerating crystallization; crystallizing the semiconductor film to form a crystalline semiconductor film; and removing the catalytic element by gettering.

In one of the first to third manufacturing method, the second insulating film is formed smaller in thickness than the first insulating film.

Further, in one of the first to third manufacturing method, the first insulating film is heat-treated at a temperature of 200–700° C.

BRIEF DESCRIPTION OF THE DRAWINGS

FIG. 3 is an inverter circuitry, and a plan view and a cross section showing an example structure of the inverter circuit (embodiment 1).

DETAILED DESCRIPTION OF THE INVENTION

Figure 1A:
FIGS. 1A to 1E are a diagram showing the process of making a TFT (embodiment 1).

One embodiment of the invention will be explained in the following.

The inventor of this invention experimentally fabricated various structures of TFTs and has found that although the cleanliness of a clean room used is controlled to some extent, TFT's threshold voltages vary resulting in a variations in displayed images.

One of effective conventional techniques to solve the TFT's electric characteristic problem, particularly the threshold voltage variations, is to successively form the base film and the semiconductor film.

However, simply forming the base film and the semiconductor film successively does not produce TFTs with excellent characteristic and the TFTs thus formed have very low reliability. The number of pixels required to be formed on the display is increasing year by year to obtain a high-quality, highly defined display, and the mass production of TFTs places importance on the TFT reliability as well as on the prevention of threshold voltage variations. The inventor has found from a variety of experiments that improvement in reliability of TFTs is obtained simply by heat-treating the base film 200 nm or more thick. However, heat-treating the base film makes it impossible to clean the interface between the base film and the semiconductor film, which causes threshold voltage variations.

The inventor has also found that by successively forming a second base film and a semiconductor film after a first base film has been heat-treated, TFTs with a very high performance not achievable with the conventional TFTs can be manufactured. The structure of the invention is not a simple combination of conventional technologies but can only be realized by composite technologies which include the heat treatment of the first base film, the formation of a clean interface between the second base film and the semiconductor film, the alleviation of stress between the heat-treated first base film and the semiconductor film, and the improved firmness in contact between the films. These technologies have enabled a significant progress from the conventional TFT characteristics.

The second base film according to the invention may use a silicon oxide film, a silicon nitride film, a silicon oxynitride film ($SiO_xN_y$), or a laminated film of these. When the alleviation of stress is emphasized, a silicon oxide film is preferred. If importance is given to the prevention of diffusion of impurities, a silicon nitride film is preferred. An optimum material is a silicon oxynitride film which has a lower stress than the silicon nitride film and has a greater impurity diffusion prevention effect than the silicon oxide film. Means for forming the second base film 101b and then the semiconductor film successively include such known means as a thermal CVD method, a plasma CVD method, a sputter method, an evaporation method, and a reduced pressure thermal CVD method. If the thickness of the second base film is in the range of 10–100 nm or preferably 20–60 nm, the second base film forms a clean interface which serves as a buffer layer that alleviates a stress between the first base film and the semiconductor film with a different thermal expansion coefficient from that of the first base film.

According to the invention, even in a large-scale clean room it is possible to realize a semiconductor film with a very high quality and a clean interface at the same time regardless of the cleanliness in the clean room. Hence, the cost increase caused by raising the cleanliness level in the clean room can be suppressed.

Further, because the invention can reduce variations produced as a result of exposing the semiconductor devices to open air, it is also possible to reduce variations among lots or substrates.

Embodiments of the invention will be described in detail in the following.

It should be noted that the application of this invention is not limited to the following embodiments.

Embodiment 1

This embodiment explains an example case where a top gate type TFT is manufactured using the invention. In this embodiment, an N-channel TFT is used.

By referring to FIGS. 1 to 4, which are simplified cross sections, the semiconductor apparatus and the method of manufacture thereof according to this invention will be described briefly.

First, a substrate 100 is prepared. The substrate 100 may use, for example, a glass substrate, a quartz substrate, an insulating substrate such as crystalline glass, a ceramic substrate, a stainless steel substrate, a metal substrate (tantalum, tungsten, molybdenum, etc.), a semiconductor substrate, and a plastic substrate (polyethylene terephthalate substrate). In this embodiment, a glass substrate (Corning 1737: strain point of 667° C.) was used for the substrate 100.

Next, a first insulating film (referred to as a first base film in this specification) 101a is formed over the substrate 100. The first insulating film 101a may use a silicon oxide film, a silicon nitride film, a silicon oxynitride film ($SiO_xN_y$), or a laminated film of these. The first insulating film 101a may be formed to a thickness range of 100–500 nm by using a known means such as thermal CVD method, plasma CVD method, sputter method, evaporation method and reduced pressure thermal CVD method. Heat-treating the base film 200 nm or more thick can sufficiently prevent diffusion of impurities from the substrate and therefore can manufacture TFTs with high reliability. In this embodiment, the first base film 101a is a silicon oxide film which was formed to a thickness of 200 nm by a plasma CVD apparatus using TEOS and oxygen ($O_2$) as a source gas (FIG. 1A).

Figure 1B:

Next, the first base film 101a is heat-treated to form a first base film 101a' (FIG. 1B). The heat treatment is done at a temperature below the strain point of the substrate, preferably in the range of 200–700° C. In this embodiment, it was done at 640 C for four hours. This heat treatment is necessary for improving the reliability of TFT. At this time the surface of the first base film 101a is exposed to the atmosphere.

Figure 1C:
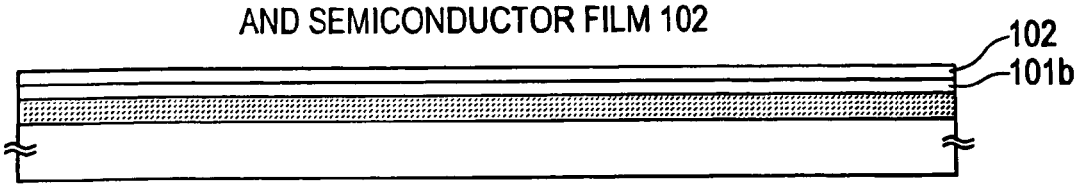

Next, over the heat-treated first base film 101a', a second insulating film 101b (hereinafter referred to as a second base film) and a semiconductor film 102 are formed in layers without being exposed to the atmosphere (FIG. 1C). This will form a good interface between the semiconductor film, particularly a channel forming region, and the second base film 101b.

Although the semiconductor film and the heat-treated first base film are not in direct contact with each other, the reliability of the TFT can be improved by reducing the thickness of the second base film compared with the first base film.

That is, in this embodiment, the heat-treated first base film improves the reliability of the TFT, and the second base film forms a good $Si/SiO_2$ interface.

The impurity concentration in the interface between the first base film and the second base film is higher than that of the interface between the second base film and the active layer because the former interface is exposed to the atmosphere, and a sharp peak in impurity concentration appeared at the former interface. The concentration peak of boron was $3 \times 10^{17}$ atoms/cm$^3$ at maximum.

The second base film 101b may use a silicon oxide film, a silicon nitride film, a silicon oxynitride film (SiO$_X$N$_Y$), or a laminated film of these. The second base film 101b can be formed to a thickness range of 10–100 nm, preferably 20–60 nm, by known means such as thermal CVD method, plasma CVD method, sputter method, evaporation method and reduced pressure thermal CVD method. In this embodiment, a silicon oxide film was formed to a thickness of 20 nm as the second base film 101b by a plasma CVD apparatus using TEOS and oxygen (O$_2$) as a source gas.

The semiconductor film 102 may use an amorphous silicon film, an amorphous semiconductor film having microcrystals, a microcrystalline semiconductor film, an amorphous germanium film, an amorphous silicon germanium film expressed as Si$_X$Ge$_{1-X}$ (0<X<1), or a laminated film of these in the thickness range of 20–70 nm (typically 40–50 nm). The semiconductor film 102 may be formed by known means such as thermal CVD method, plasma CVD method, reduced pressure thermal CVD method and sputter method. In this embodiment the semiconductor film 102 was formed with an amorphous silicon film 50 nm thick.

Figure 7:
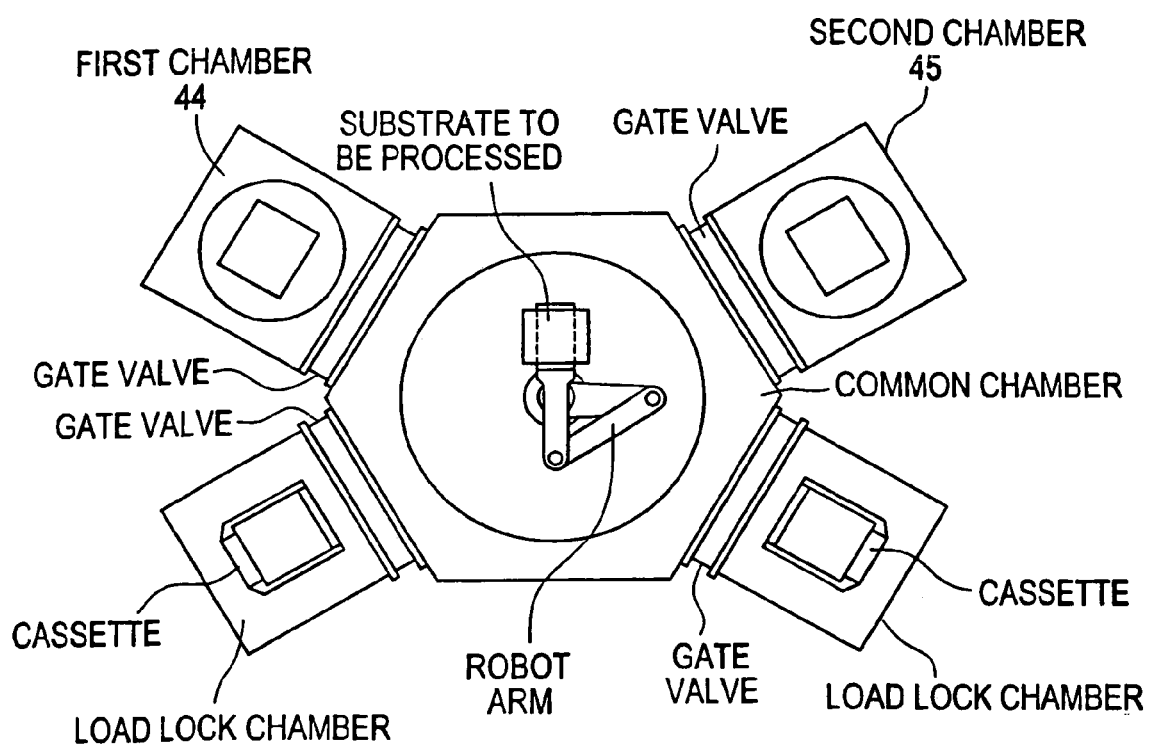
FIG. 7 shows an example of film forming apparatus (embodiment 1)

In this embodiment, a multichamber having at least a first chamber 44 for forming the second base film and a second chamber 45 for forming the semiconductor film was used (shown in FIG. 7) and the substrate was moved between these chambers without exposing it to the atmosphere to form these films in layers. The laminated film may also be formed by using the same chamber and changing the reactive gas.

Figure 1D:
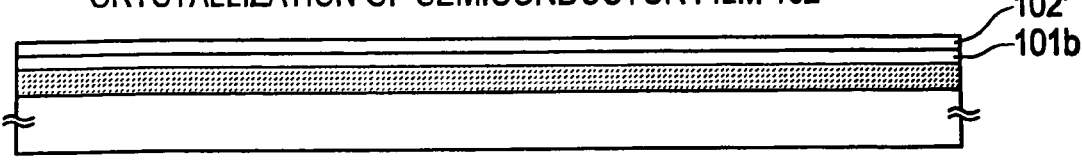

After the state of FIG. 1C is obtained, the semiconductor film 102 of amorphous silicon film is subjected to a crystallization process to form a semiconductor film 102' of crystalline silicon film. In this embodiment, the semiconductor film was crystallized by applying an infrared or ultraviolet beam to the film (called a laser crystallization process). When an ultraviolet beam is used for crystallization, a strong beam from an excimer laser or ultraviolet lamp may be used. When an infrared beam is used, a strong beam from an infrared laser or infrared lamp may be used. In this embodiment an excimer laser light was formed into a beam and applied to the semiconductor device in the atmosphere (FIG. 1D). Although a thin oxide film is formed over the surface when the laser crystallization process is performed in the open air, it is not shown for the sake of simplicity. In this embodiment, the process was performed in the open air. It may, however, be performed in an inert gas or the laser crystallization may be done in vacuum.

The crystallization process may use any known technology, such as laser crystallization, thermal crystallization, and thermal crystallization using catalytic elements. The conditions of the laser crystallization (wavelength of laser beam, overlap ratio, beam intensity, pulse width, frequency of repetition, irradiation time, etc.) may be determined by considering the thickness of an insulating film 105, the thickness of an initial semiconductor film 104, substrate temperature and others. The beam irradiation conditions were set to a pulse frequency of 30 Hz, an overlap ratio of 96%, and a laser energy density of 100–500 mJ/cm$^2$, in this embodiment 359 mJ/cm$^2$. Depending on the conditions of the laser crystallization, there are cases where the semiconductor film passes through a molten state before getting crystallized and where the semiconductor film does not melt but is crystallized in a solid state or in an intermediate state between the solid state or the liquid state.

Figure 1E:
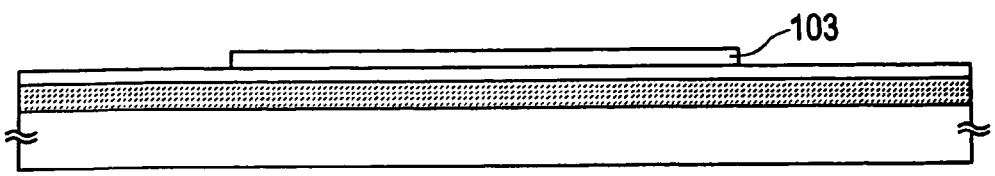

Next, the semiconductor film 102' thus obtained is patterned to form an active layer 103 of a desired shape (FIG. 1E).

After the process of FIG. 1D or 1E, a process may be introduced to dope the channel forming region with impurities to control the threshold voltage. It is also possible to change the sequence of processes of FIGS. 1D and 1E to perform crystallization after the patterning of the semiconductor film.

Figure 2A:
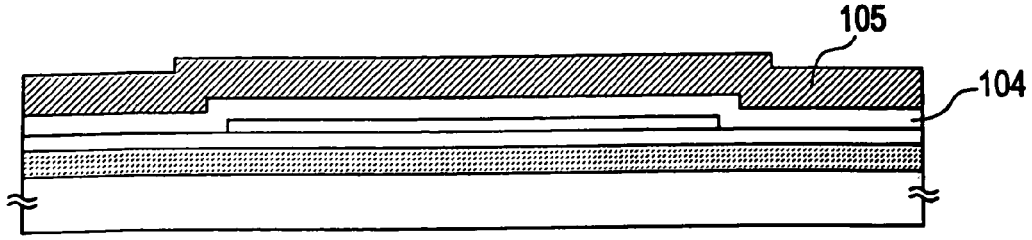
FIGS. 2A to 2D are a diagram showing the process of making a TFT (embodiment 1).

Next, insulating films (which will form a gate insulating layer in a later process) 104 and (a conductive film gate line forming layer) 105 are deposited to cover the active layer (FIG. 2A). The insulating film 104 may use a silicon oxide film, a silicon nitride film, a silicon oxynitride film (SiO$_X$N$_Y$), an organic resin film (such as BCB film), and a laminated film of these. The third insulating film 104 may be formed to a thickness range of 10–300 nm by known means, such as thermal CVD method, plasma CVD method, reduced pressure thermal CVD method, sputter method, evaporation method and coating method. In this embodiment a silicon oxide film was formed to a thickness of 150 nm as the third insulating film 104.

The conductive film 105 may use a single layer structure or laminated layer structure made mainly of such conductive materials or semiconductive materials as aluminum (Al), tantalum (Ta), copper (Cu), niobium (Nb), hafnium (Hf), zirconium (Zr), titanium (Ti), chromium (Cr), silicon (Si) and silicide. The conductive film 105 may have a thickness range of 10–500 nm. In this embodiment, an aluminum film 400 nm thick was formed as the conductive film 105.

Figure 2B:
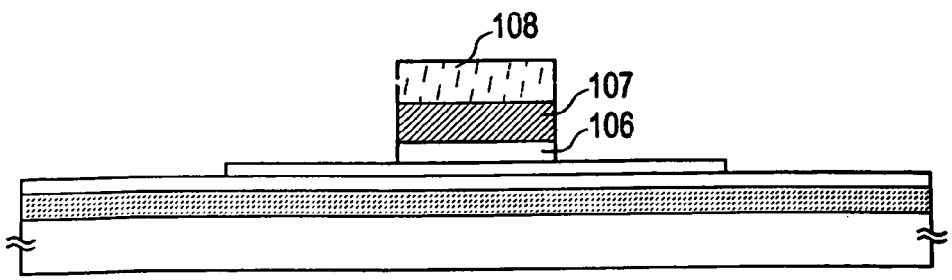
Figure 2C:
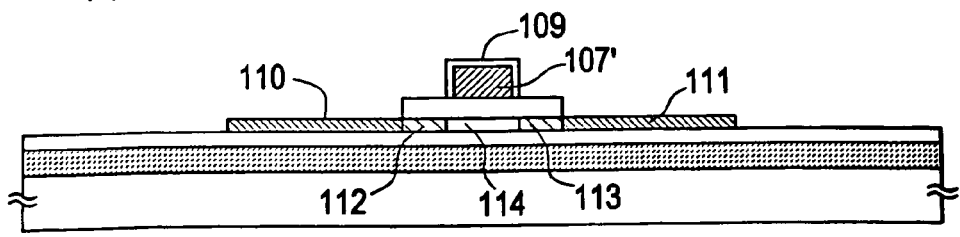

Next, a mask 108 is used to pattern the conductive film 105 to form a material layer 107 for making gate lines and also the third insulating film 104 to form a gate insulating layer 106 (FIG. 2B).

Then, in this embodiment, the material layer 107 forming the gate lines is subjected to a first anodic oxidation to form a porous anode oxide film (not shown). It further undergoes a second anodic oxidation to form a fine anode oxide film 109. After this, the porous anode oxide film and the mask 108 are removed. Rather than performing the anodic oxidation, it is possible to add a process which forms a passivation film, an insulating film covering the gate lines for protection.

Next, with the gate lines as a mask, impurities for giving N-type conductivity are implanted into the active layer 103. It is also possible to form a mask to selectively add the impurities to a predetermined area. Addition of impurities may be done by using know means such as ion implanting, plasma doping and laser doping. It is, however, necessary to adjust the doping condition, dose and acceleration voltage to ensure that a predetermined amount of impurity ions will be implanted into desired areas of the active layer. In this embodiment, phosphorus was used as an impurity for the N type conductivity and its amount was adjusted so that the phosphorus concentration in low-concentration impurity regions represented by 112 and 113 would be in the range of $1 \times 10^{15}$ to $1 \times 10^{17}$ atoms/cm$^3$ when measured by SIMS analysis. The amount of dose was also adjusted so that the phosphorus concentration in high-concentration impurity regions indicated by 110 and 111 would be in the range of $1 \times 10^{20}$ to $8 \times 10^{21}$ atoms/cm$^3$ when measured by SIMS analysis.

The high-concentration impurity regions (n$^+$ regions) 110, 111 will become a source region and a drain region, and the low-concentration impurity regions (n⁻ regions) 112, 113 will become an LDD region. The regions that are not injected with phosphorus ions and boron ions will become an intrinsic or substantially intrinsic channel forming region 114 which constitutes a carrier moving path.

The intrinsic region denotes a region not containing impurities at all which may change the Fermi level. The substantially intrinsic region denotes a region in which electrons and holes are completely balanced to cancel the conductivity type,. i.e., the region that contains N or P type impurities in a concentration range ($1\times10^{15}$ to $1\times10^{17}$ atoms/cm$^3$ when measured by the SIMS analysis) that permits the threshold voltage control or the region which cancels the conductivity type by intentionally adding an impurity of opposite conductivity type.

In FIG. 2B, rater than performing the patterning of the insulating film 104, it is possible to add impurities through the insulating film 104 and then pattern the insulating film 104.

Next, known technologies, such as thermal anneal or laser anneal, are performed to obtain a capability to activate impurities in the source region and the drain region or a capability to recover the crystal structure of the active layer that was damaged by the doping process. In this embodiment, a laser beam with a pulse frequency of 50 Hz and a laser energy density of 179 mJ/cm$^2$ was applied before performing the thermal activation processing (at 450° C. in a nitrogen atmosphere for 2 hours).

Figure 2D:
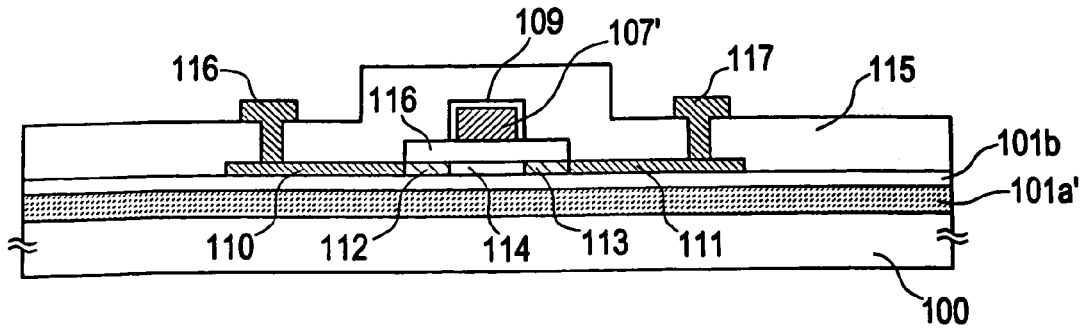

Next, an interlayer insulating film 115 is deposited and is formed with contact holes for exposing the source region and the drain region, after which a metal film is formed. The metal film is then patterned to form metal wires 116–117 that contact the source region and the drain region. Finally, hydrogenation processing is carried out (at 350° C. in a hydrogen atmosphere for 2 hours) (FIG. 2D). In this way, the manufacture of the N-channel TFT is completed.

In this embodiment the oxygen concentration in the interface between the second base film and the channel forming region was able to be set below $2\times10^{19}$ atoms/cm$^3$ and the carbon and nitrogen concentrations below $5\times10^{18}$ atoms/cm$^3$.

While this embodiment has shown the method of manufacturing the N-channel TFT, a P-channel TFT can be manufactured simply by injecting boron ions for P-type conductivity as an impurity ion during the impurity injection process.

Figure 8:
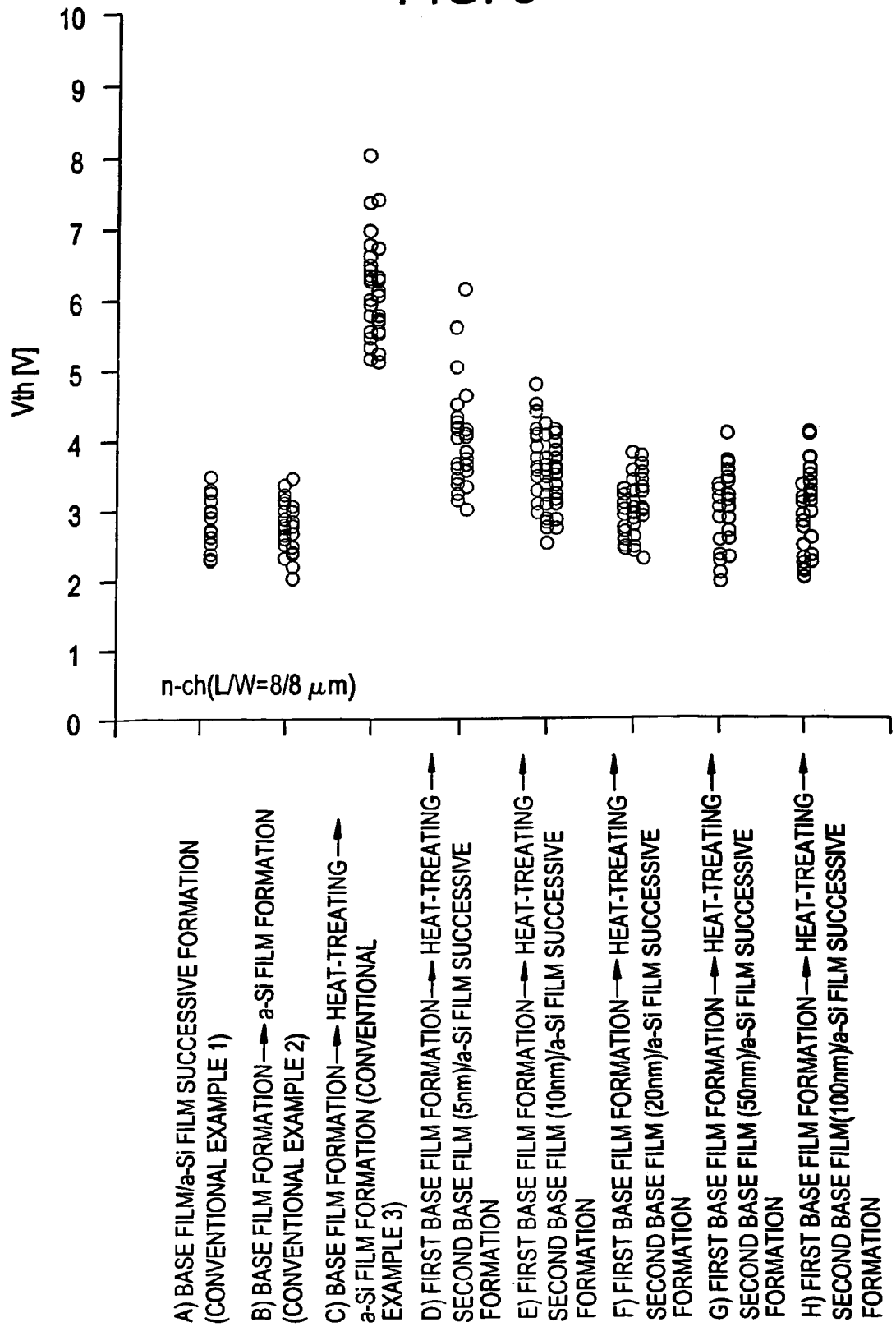
FIG. 8 is a distribution diagram of threshold voltages of N-channel TFTs (embodiment 1).
Figure 9:
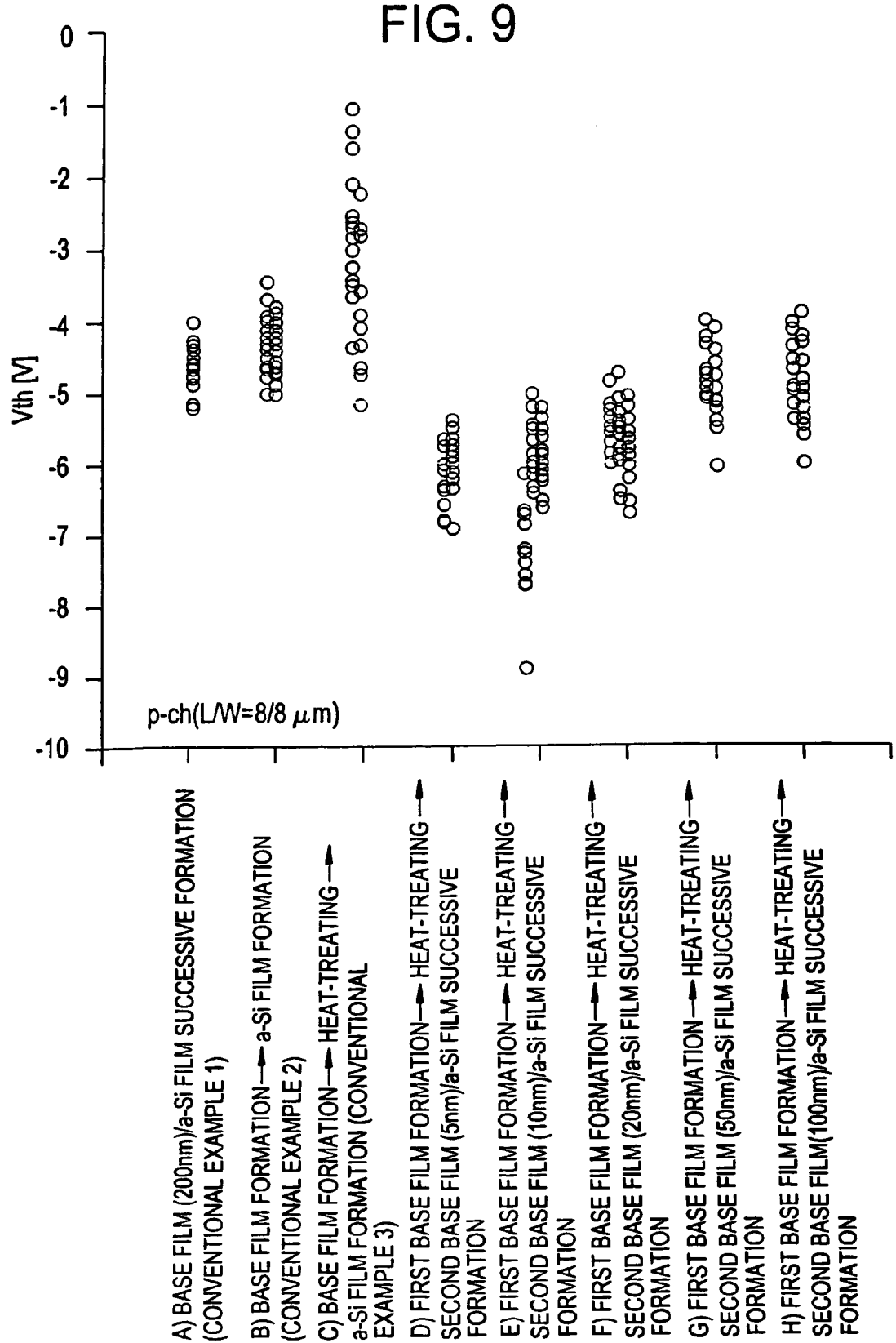
FIG. 9 is a distribution diagram of threshold voltages of P-channel TFTs (embodiment 1).

In this embodiment, to compare the influence of the second base film and the influence of the heat treatment of the insulating film, measurements were made of the threshold voltage of a TFT manufactured by the method of this embodiment and the threshold voltage of a TFT manufactured by a different method. Further, to compare the influence of the thickness of the second base film, TFTs having second base films with different thicknesses were fabricated by the above-described manufacturing method and the threshold voltages (Vth) of these TFTs were measured. In this embodiment, a plurality of substrates fabricated under the same conditions were prepared and TFTs [L (channel length)/W (channel width)=8/200 m] at random measuring points in the substrates were measured by using a root ID extrapolation method (drain voltage VD=14V, gate voltage VG=−20V to 20V). FIG. 8 shows a distribution of threshold voltages of N-channel TFTs. FIG. 9 shows a distribution of threshold voltages of P-channel TFTs.

The threshold voltage (Vth) in this specification signifies a voltage value required to be applied to the gate line to switch a TFT from the OFF state to the ON state.

Figure 10:
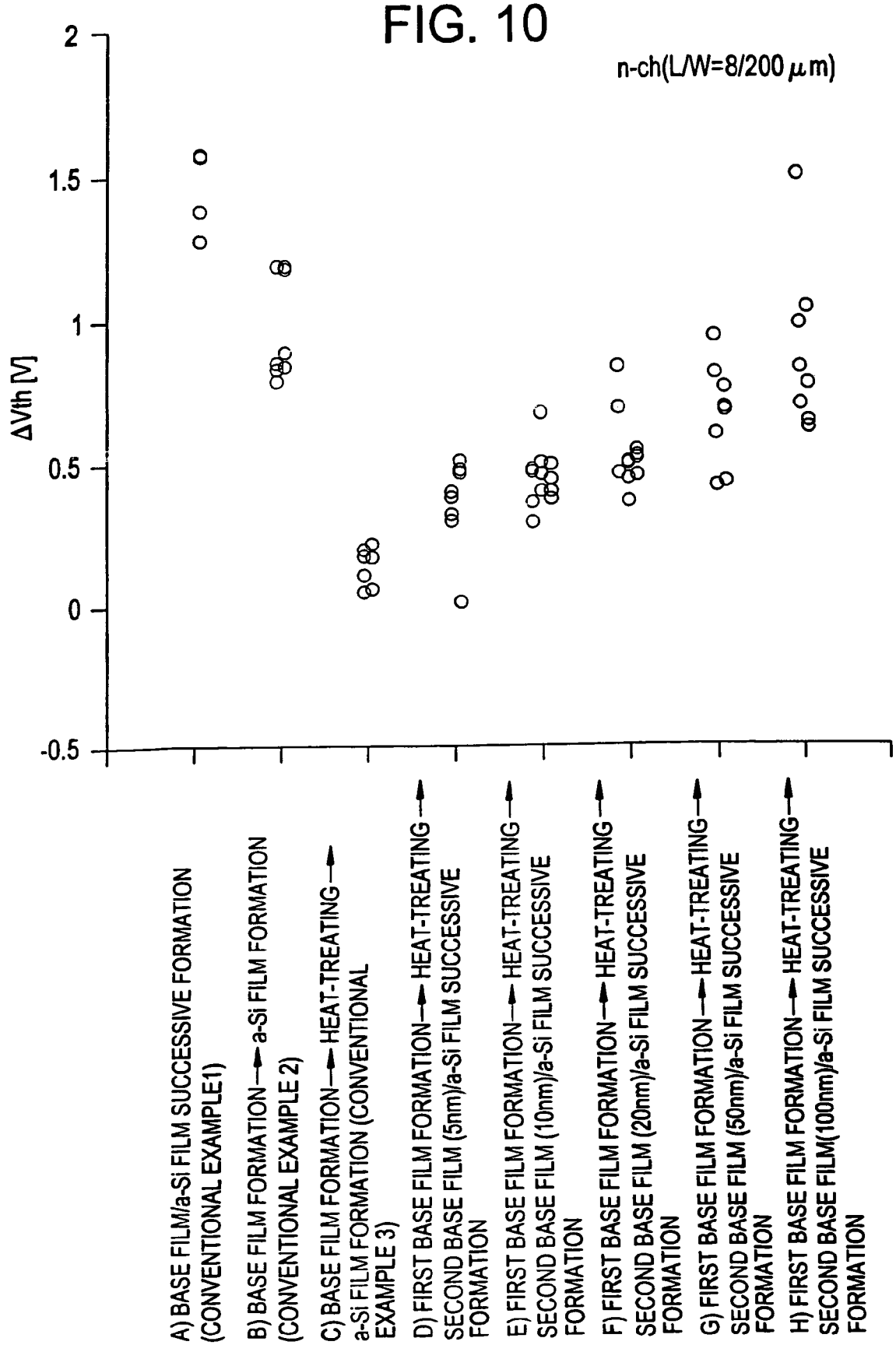
FIG. 10 is a distribution diagram showing threshold voltage variations of N-channel TFTs (embodiment 1).
Figure 11:
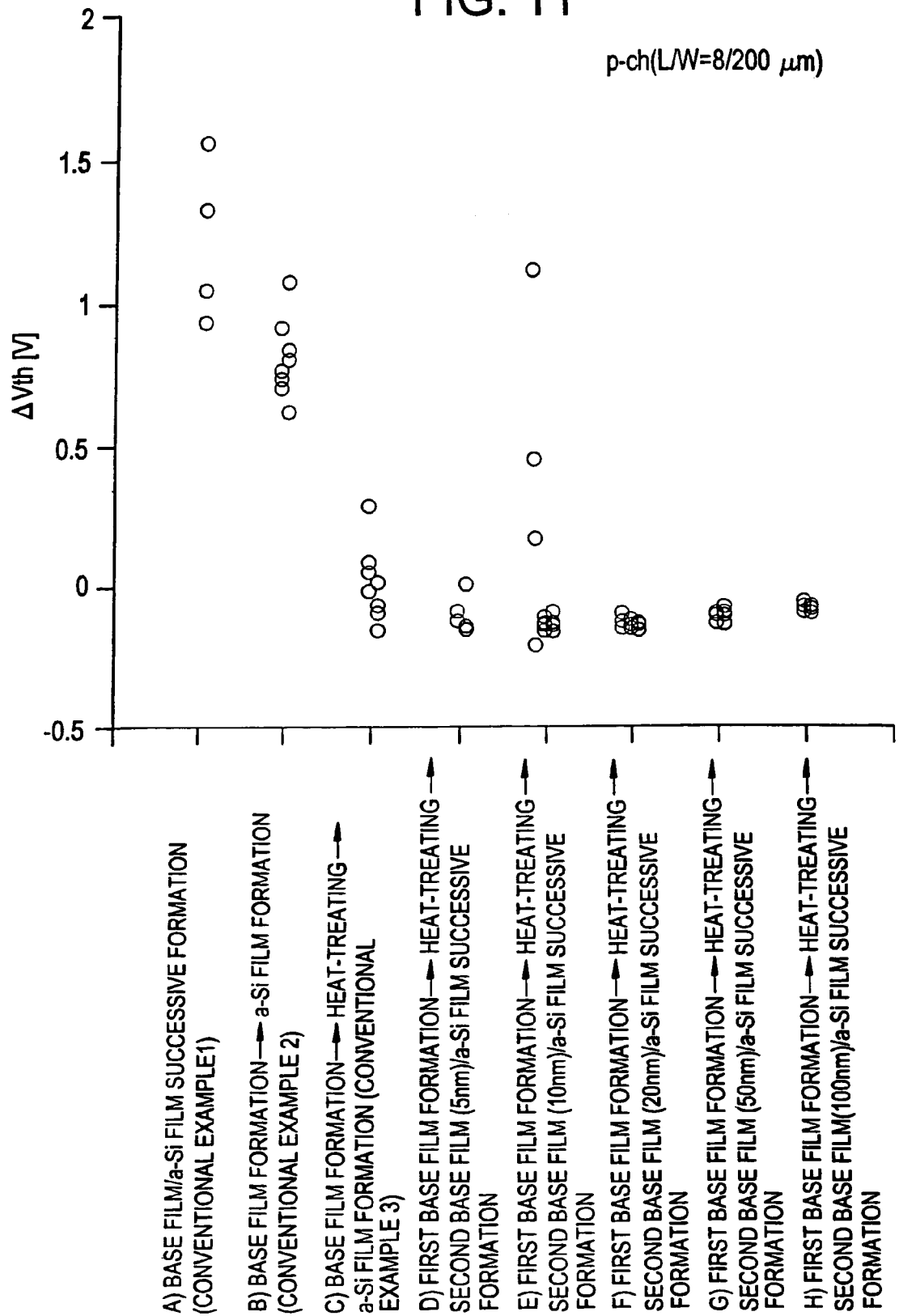
FIG. 11 is a distribution diagram showing threshold voltage variations of P-channel TFTs (embodiment 1).

Similarly, FIG. 10 shows the threshold voltage variations (Vth) of N-channel TFTs and FIG. 11 shows variations in the threshold voltage of P-channel TFTs. Vth is obtained as follows. Ten TFT measurements were made by the root ID extrapolation method to give stresses to the TFT [L/W=8/8 m], and the threshold value Vth1 at the first measurement and the threshold value Vth10 at the tenth measurement are picked up to determine the amount of change Vth. The smaller the value of Vth, the smaller the deterioration of TFT and the higher the reliability.

The TFTs manufactured under the following conditions were measured (at four to 16 points in each of two or three substrates) to obtain data A-H.

A) TFT formed successively with a base film and an a-Si film (conventional example 1)

B) TFT formed with a base film and then with an a-Si film (conventional example 2)

C) TFT formed with a base film, heat-treated and then formed with an a-Si film (conventional example 3)

D) TFT formed with a first base film and heat-treated, and then formed successively with a second base film (5 nm) and an a-Si film E) TFT formed with a first base film and heat-treated, and then formed successively with a second base film (10 nm) and an a-Si film F) TFT formed with a first base film and heat-treated, and then formed successively with a second base film (20 nm) and an a-Si film G) TFT formed with a first base film and heat-treated, and then formed successively with a second base film (50 nm) and an a-Si film H) TFT formed with a first base film and heat-treated, and then formed successively with a second base film (100 nm) and an a-Si film The influences of the second base film will be discussed in the following.

FIGS. 8–11 show that the data A (conventional example 1) has Vth values in the 2–3 V range, which is satisfactory, but has a large ΔVth value, which means that the TFT has low reliability.

As to the data B (conventional example 2), the Vth values are shifted slightly to the plus side when compared with the data A and has a large ΔVth value as with the data A. From these data (data A and data B), the inventor has found that continuously forming the base film and the a-Si film without exposing them to the atmosphere can keep the interface little contaminated with impurities, which in turn suppresses the plus-side shift of the Vth.

As to the data C (conventional example 3), the Vth values are shifted significantly to the plus side and scattered in the range of 5–8 V but the ΔVth value is small, indicating that the TFT is very reliable. From these results, the inventor has found that heat-treating the base film can reduce the amount ΔVth of change in the threshold voltage, i.e., can improve the reliability of TFT.

In contrast to the TFTs of these conventional examples 1–3, the TFT of this embodiment has the first base film heat-treated and then has the thin second base film and a-Si film (semiconductor film) successively formed, thereby suppressing the plus-shift of Vth and making the ΔVth small and therefore TFT highly reliable, as shown in data D-H, particularly data E (this embodiment).

From the above findings, the inventor has found that although the threshold voltage (Vth) depends on a film directly in contact with the semiconductor film, i.e., the interface characteristic of the thin second base film and the a-Si film, the threshold voltage variation (ΔVth) does not result from the film directly in contact with the semiconductor film, i.e., the thin second base film, but from the heat-treated first base film. It is also found that the second base film functions as a buffer layer that alleviates stresses between the first base film and the semiconductor film.

Now, the influence of the thickness of the second base film will be discussed in the following.

Data D–H shown in FIGS. 8 and 9 show that the Vth value of N-channel TFT monotonously decreases with an increase in the thickness of the second base film and that the Vth value of P-channel TFT greatly changes toward the negative side before monotonously increasing with the thickness increase. Data D–H of FIGS. 10 and 11 show that the ΔVth of P-channel TFT decreases at the thickness of the second base film of 20 nm or more and that the ΔVth of N-channel TFT increases at the thickness of 50 nm or more.

From these results, when the first base film is 200 nm thick, it is desired that the thickness of the second base film be set to 10 nm or more, preferably in the range of 20–50 nm. It should be noted that the above film thickness is a set thickness value and that the actual thickness is slightly larger than the setting value and therefore the second base film preferably has the measured thickness value of 20–60 nm.

While this embodiment has conducted a reliability test to measure the threshold voltage variation (Vth), it is possible to perform a general bias-temperature-stress reliability test and still obtain similar test results.

An example structure of the semiconductor apparatus, which has semiconductor circuits made of semiconductor devices (TFTS) manufactured by the method of this embodiment, will be explained by referring to FIGS. 3 and 4.

In this embodiment, FIG. 3 shows a CMOS circuit (inverter circuit) forming a part of a peripheral drive circuit. Reference numbers used in FIG. 3 are identical with those used in FIG. 1 or 2. In FIG. 3, the cross section taken along a dashed line A–A' in the plan view of the inverter circuit corresponds to the cross sectional structure of the CMOS circuit. The terminals a, b, c, d in the inverter circuit of FIG. 3A are in one-to-one correspondence with the terminals a, b, c, d of the plan view of the inverter circuit.

In FIG. 3, all TFTs (thin-film transistors) are formed on a laminated film of a first base film 101a' and a second base film 101b provided on the substrate 100. In the case of the N-channel TFT in the inverter circuit, active layers formed on the second base film include a channel forming region 114, an N-type high concentration impurity regions (n$^+$ regions) 110, 111, and low concentration impurity regions (n$^-$ regions) 112, 113 between the channel forming region and the high concentration impurity regions. Over the channel forming region is formed a gate line 107' with a gate insulating layer 106 interposed therebetween. The gate line 107' is protected by an anode oxide film 109. The interlayer insulating film 115 overlying the anode oxide film 109 is formed with contact holes, through which the high concentration impurity regions are connected with wires 116, 117.

In the case of the P-channel TFT, the active layer includes a high concentration impurity regions (p$^+$ regions) 110', 111', a channel forming region 114', and a low concentration impurity regions (p$^-$ regions) 112', 113' between the p+ type regions and the channel forming region. The p$^+$ regions 110', 111' are formed with wires 116', 117'. Other areas than the active layer are similar in structure to the N-channel TFT.

Figure 4A:
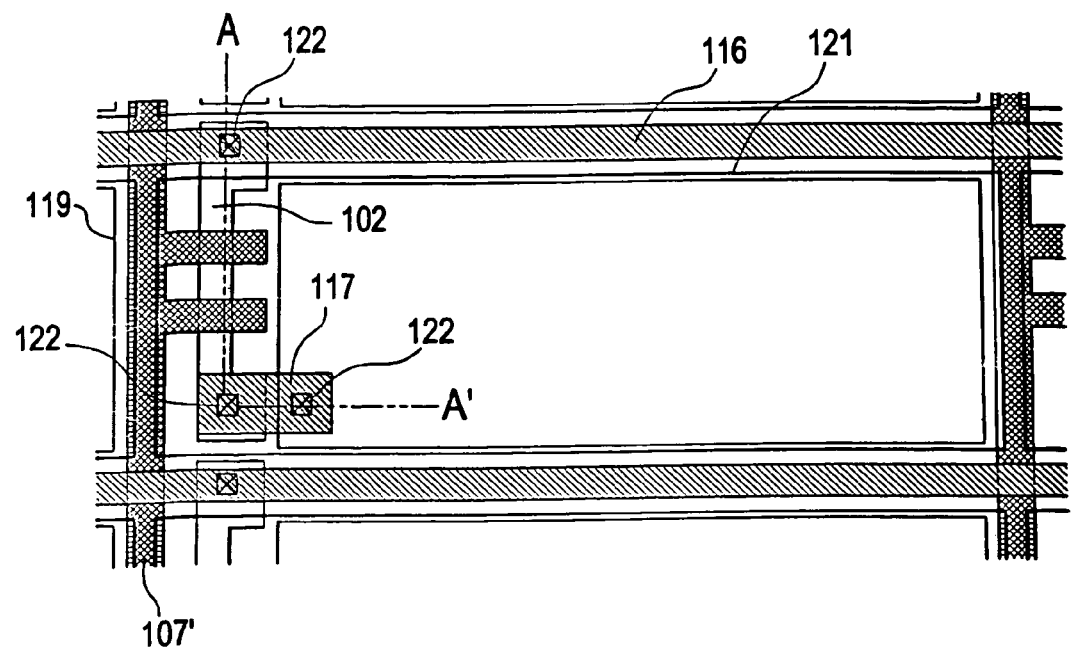
FIGS. 4A and 4B are a plan view and a cross section showing an example structure of a pixel matrix circuit (embodiment 1).
Figure 4B:
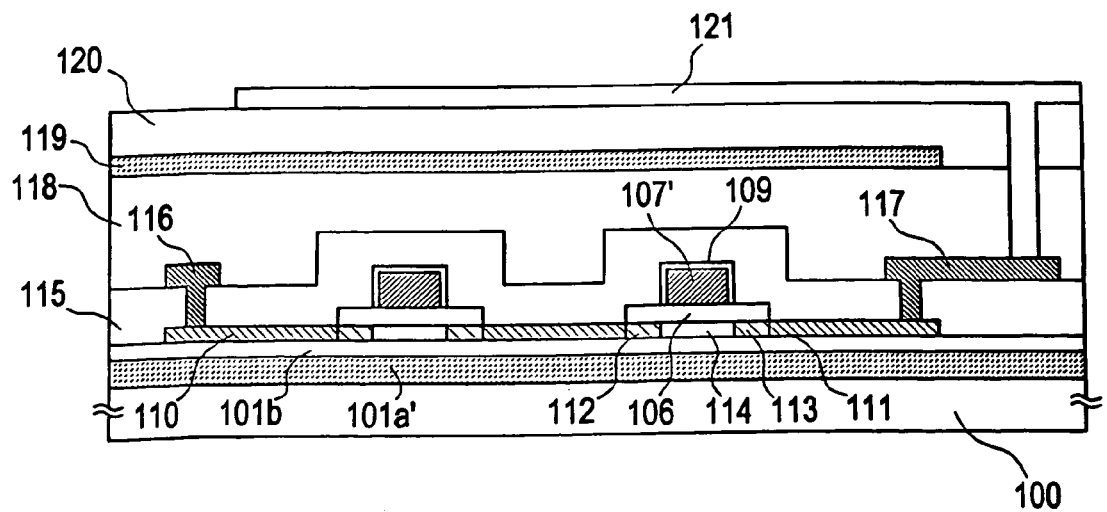

FIG. 4 shows a pixel TFT (N-channel TFT) that forms a part of the pixel matrix circuit. The reference numbers used in FIG. 4 are identical with those of FIG. 1 or 2. In FIG. 4A, the cross section taken along the dotted line A–A' corresponds to the cross sectional structure of the pixel matrix circuit of FIG. 4B.

The N-channel TFT formed in the pixel matrix circuit is the same in structure as the N-channel TFT of the inverter circuit up to the first interlayer insulating film 115. The high concentration impurity regions (n$^+$ regions) 110, 111 are connected with wires 116, 117, over which are formed a second interlayer insulating film 118 and a black mask 119, over which a third interlayer insulating film 120 is formed, with a pixel electrode 121 made of transparent conductive film such as ITO and SnO$_2$ connected to the wire. The pixel electrode covers the pixel TFT and, together with the black mask, forms an auxiliary capacitance. Although this embodiment manufactured a transparent LCD as an example, it is possible to manufacture a reflective type LCD by using a reflective metal material as the pixel electrode material and performing changes in the patterning of the pixel electrode or adding/deleting some processes as required.

Although in this embodiment the pixel TFT gate line in the pixel matrix circuit is formed as a double gate structure, it is possible to use a multigate structure such as a triple gate structure in order to reduce variations of the turn-off current. To improve the aperture ratio a single gate structure may be employed.

It is also possible to fabricate the peripheral drive circuit of FIG. 3 and the pixel matrix circuit of FIG. 4 on the same substrate.

While this embodiment explains the top gate type TFT, the configuration of this invention can also be applied to the bottom gate type TFT.

Embodiment 2

This embodiment describes an example case in which a crystalline silicon film is produced by a method different from that of the embodiment 1. This embodiment uses a catalytic element that promotes the crystallization of silicon to form a crystalline semiconductor film. The basic structure is almost similar to the embodiment 1 and thus the explanation will focus only on the differing points.

This embodiment is the same as the embodiment 1 up to the process of continuously forming the second base film and the semiconductor film 102 (FIG. 1C).

After the same state as that of FIG. 1C has been obtained, a catalytic element that promotes the crystallization of silicon is introduced into the surface of the semiconductor film 102. As the catalytic elements that accelerate silicon crystallization, one or more of Ni, Fe, Co, Pt, Cu, Au, Ge are chosen. Of these catalytic elements, this embodiment used Ni, which has a fast diffusion speed in the amorphous silicon film and can provide a very good crystallinity.

The catalytic elements may be introduced over the entire surface of the amorphous silicon film or to any desired locations selected by forming an appropriate mask.

The catalytic elements may be introduced into the amorphous silicon film by bringing the catalytic elements into contact with the surface of the amorphous silicon film or by holding the elements in the amorphous silicon film. For example, a sputter method, a CVD method, a plasma processing method, a suction method, an ion injection method, and a method of coating a solution containing the catalytic elements are available. Of these methods, the solution coating method is useful because it is simple and can easily adjust the concentration of the catalytic elements. A variety of metal salts may be used and solvents include water, alcohol, aldehyde, ether and other organic solvents, or a mixture of water and organic solvent. In this embodiment, the coating method was used and a solution containing 10–10,000 ppm, preferably 100–10,000 ppm (in weight), of nickel was applied. It is necessary, however, to adjust the amount of solution to be applied by considering the thickness of the amorphous silicon film. The nickel concentration in the amorphous silicon film thus formed will be $1\times10^{19}$ to $1\times10^{21}$ atoms/cm$^3$.

After the catalytic elements were introduced into the amorphous silicon film as described above, the semiconductor film is heat-treated (at 550° C. for 4 hours) for crystallization to produce a crystalline semiconductor film. Instead of performing the heat treatment, a laser beam may be applied.

After the above process, a gettering process should preferably be performed to reduce the catalytic elements in the crystalline semiconductor film (techniques disclosed in Japanese Patent Laid-Open No. 9-312260 and Japanese Patent Laid-Open No. 8-330602). The official gazette of Japanese Patent Laid-Open No. 9-312260 describes a gettering process which getters the catalytic elements in the crystalline semiconductor film into a thermal oxide film that was formed during the thermal oxidation (450–1100° C.) in the oxidizing atmosphere and removes the thermal oxide film.

In this embodiment, by taking advantage of the gettering action of phosphorous, the nickel element in the crystalline semiconductor film was reduced.

After the above crystallization process is over, the gettering process involves, first, selectively doping phosphorous into the crystalline semiconductor film by using a mask to form phosphorous-doped regions with phosphorous concentration in the range of $1\times10^{19}$ to $1\times10^{21}$ atoms/cm$^3$. Next, it is heated at 600° C. for 12 hours in the nitrogen atmosphere to capture nickel in the phosphorous-doped regions. This can reduce the nickel concentrations in other than the phosphorous-doped regions to $5\times10^{17}$ atoms/cm$^3$ or lower (preferably $2\times10^{17}$ atoms/cm$^3$ or lower).

Next, after the above gettering process is completed, the mask is removed and then the semiconductor film is patterned to form an active layer. Here, the regions other than the phosphorous-doped regions are used to form an active layer.

The process after the patterning of the active layer follows the similar steps to those of embodiment 1 to produce the TFT in the state of FIG. 2D.

Figure 12:
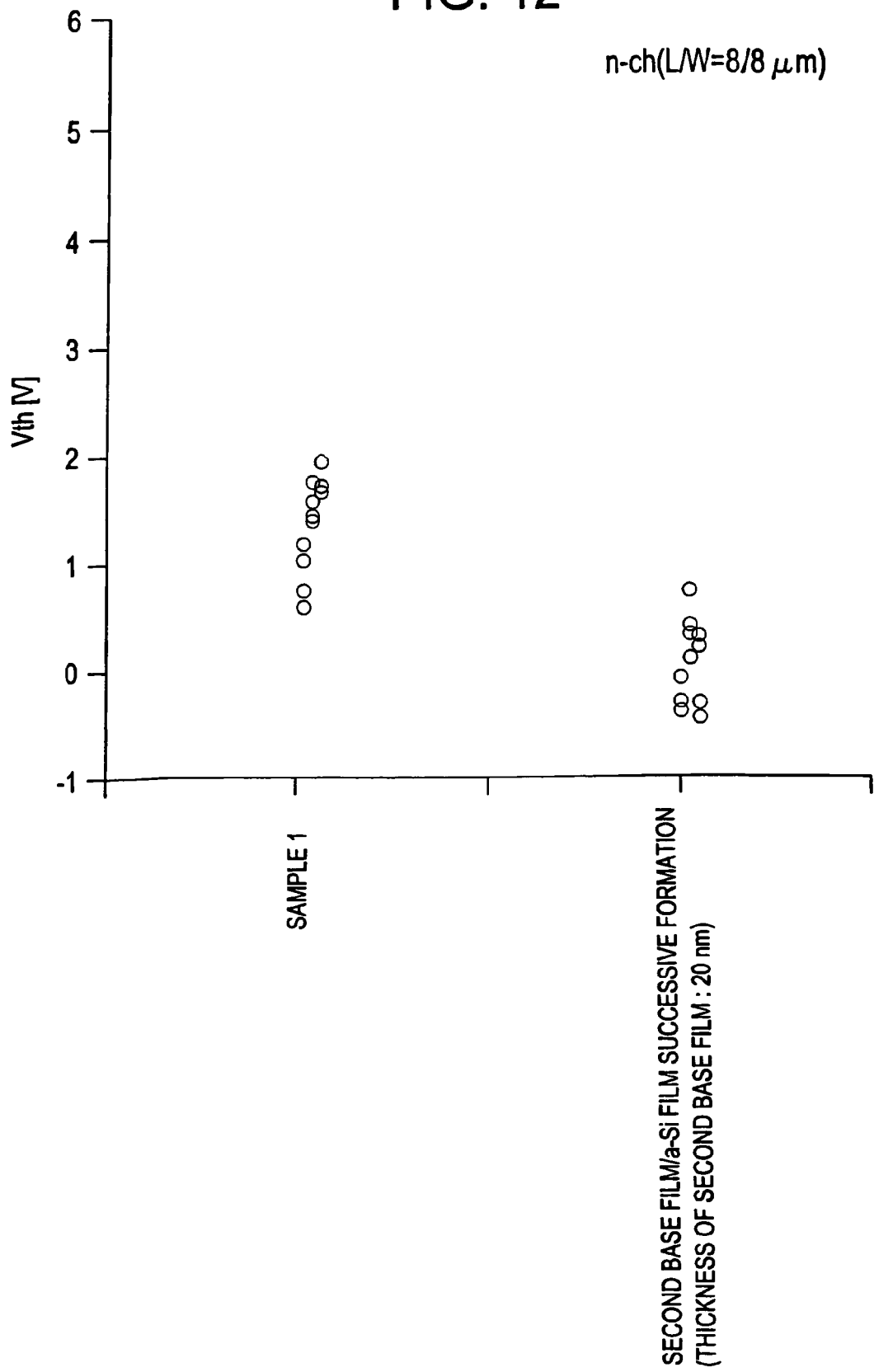
FIG. 12 is a distribution diagram of threshold voltages of N-channel TFTs (embodiment 2).
Figure 13:
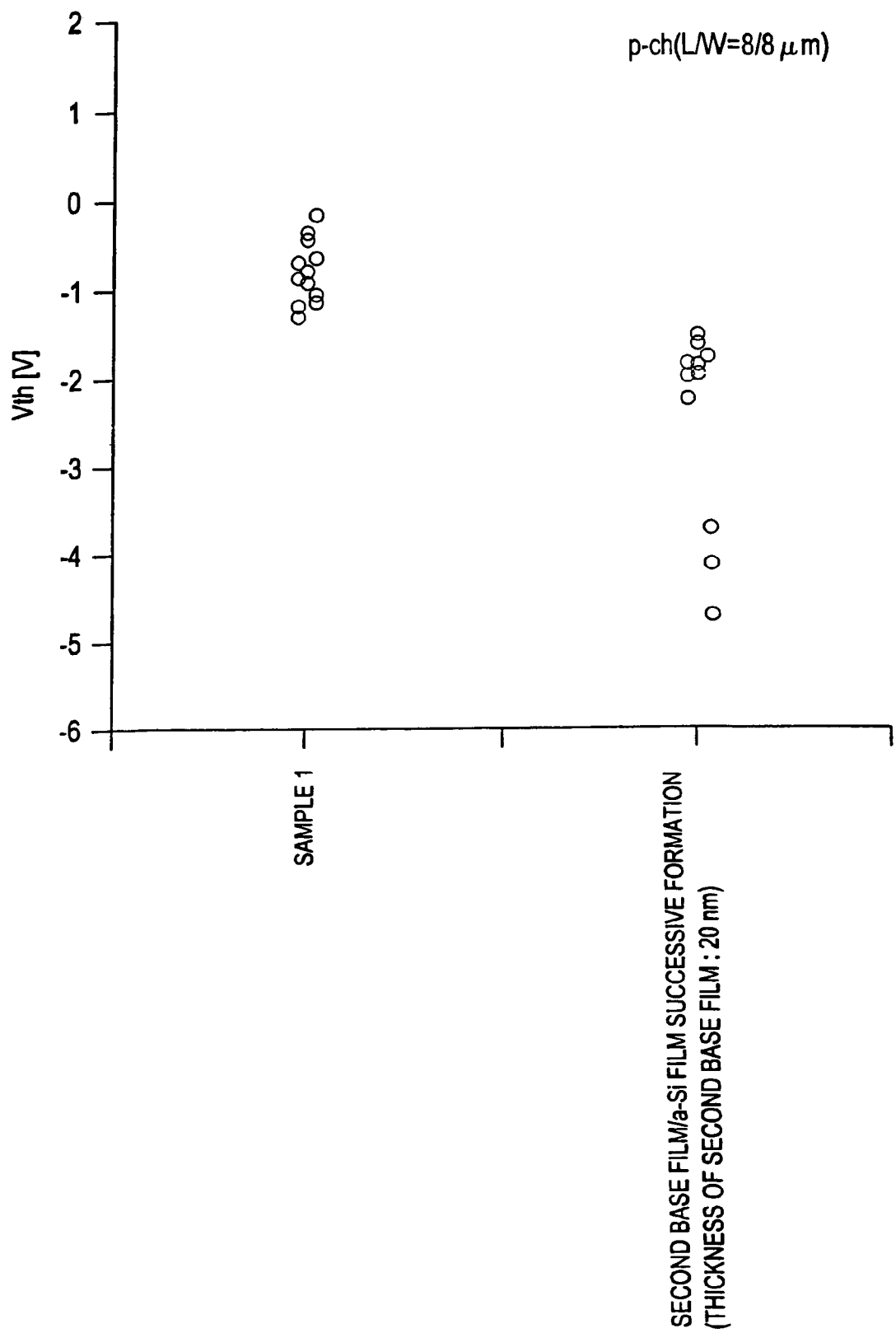
FIG. 13 is a distribution diagram of threshold voltages of P-channel TFTs (embodiment 2).

The threshold voltage Vth and the threshold voltage variation ΔVth of the TFT manufactured by the method of this embodiment were measured in a way similar to the embodiment 1. For comparison of the influences of the second base film, measurements were made of the threshold voltage (Vth) and the threshold voltage change (ΔVth) of the TFT with only the first base film 200 nm thick (sample 1). FIG. 12 is a distribution diagram of the threshold voltage of the N-channel TFT and FIG. 13 is a distribution diagram of the threshold voltage of P-channel TFT.

Figure 14:
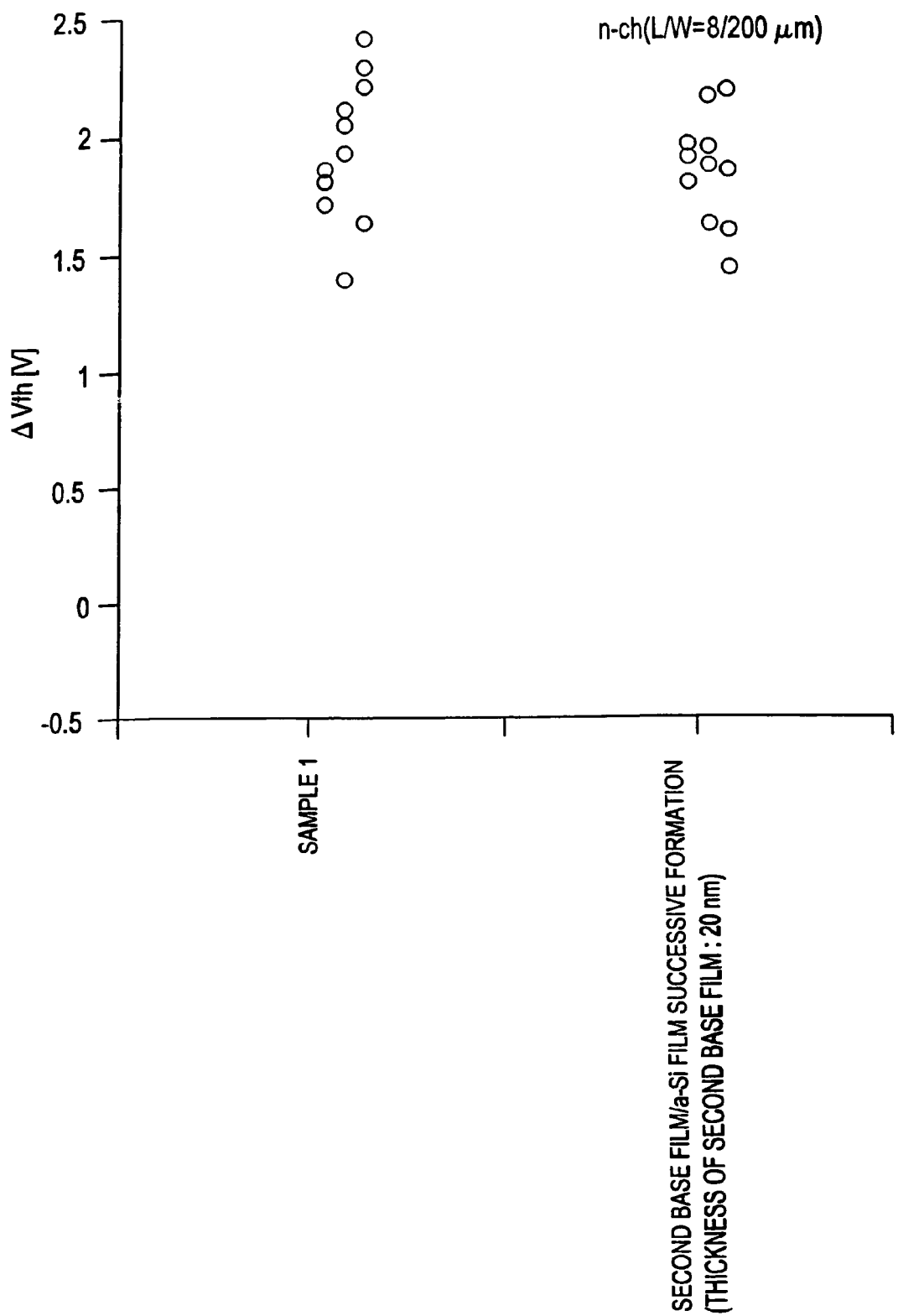
FIG. 14 is a distribution diagram showing threshold voltage variations of N-channel TFTs (embodiment 2).
Figure 15:
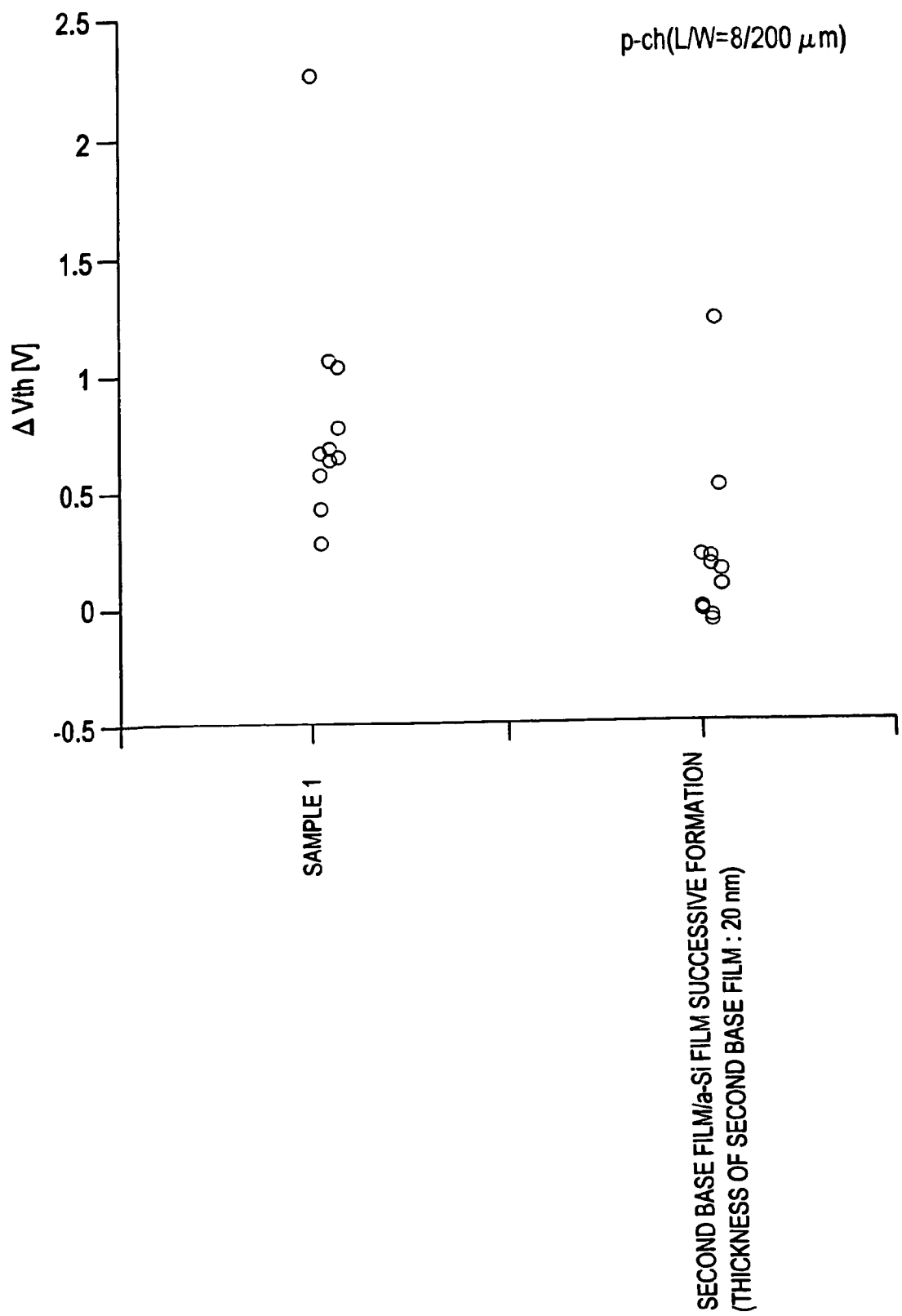
FIG. 15 is a distribution diagram showing threshold voltage variations of P-channel TFTs (embodiment 2).

Similarly, FIG. 14 is a distribution diagram of the threshold voltage variation (ΔVth) of N-channel TFT and FIG. 15 is a distribution diagram of the threshold voltage variation (ΔVth) of P-channel TFT.

The influence of the second base film will be discussed.

The data shown in FIGS. 12–15 show that this embodiment has lower threshold voltages than those of the sample 1 and that the provision of the second base film suppresses the plus-shift of the threshold voltage. Further, because the first base film is heat-treated as in the sample 1, the threshold voltage variation (ΔVth) in this embodiment is small and the P-channel TFT in particular exhibits almost no threshold voltage variation.

Embodiment 3

This embodiment describes an example case in which a crystalline semiconductor film is produced by a method different from that of the embodiment 1. This embodiment concerns a method which forms a laser beam into the one with a rectangular or square cross section and performs uniform laser crystallization processing on an area several cm$^2$ to several hundred cm$^2$ in each application of laser beam to form crystalline silicon film. The basic configuration is almost similar to the embodiment 1 and thus the explanation will focus only on the differing points.

In this embodiment, the excimer laser beam is shaped into a plane and applied in the process of FIG. 1C. The laser beam is shaped into a plane so that an area of about several tens of cm$^2$ (preferably 10 cm$^2$ or more) can be irradiated at one time. To anneal the entire irradiated surface with a desired laser energy density, a laser apparatus with a total energy output of 5 J or more, preferably 10 J or more, needs to be used.

In that case, the energy density should preferably be set at 100–800 mJ/cm$^2$ and the output pulse width at 100 nsec or more, preferably 200 nsec to 1 msec. To realize the pulse width of 200 nsec to 1 msec, a plurality of laser apparatuses need to be connected together, with the synchronization of each laser apparatus staggered to produce a mix of pulses.

By applying a plane-shaped laser beam like the one used in this embodiment, it is possible to irradiate a large area uniformly. That is, the crystallinity of the active layer (including the crystal grain size and defect density) becomes uniform, reducing variations of electrical characteristic among TFTs.

This embodiment can be easily combined with the embodiment 1 or embodiment 2 and whichever of the embodiments may be combined.

Embodiment 4

Figure 5:
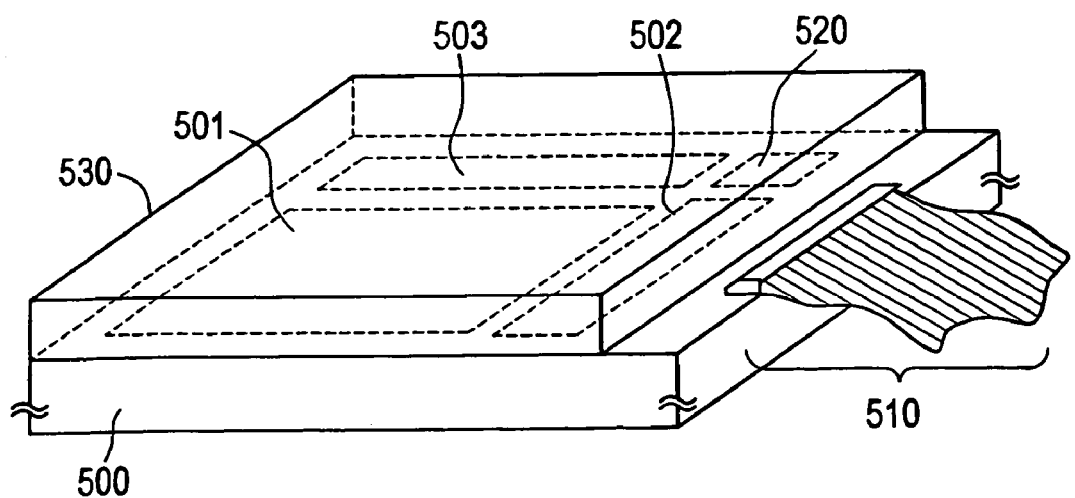
FIG. 5 is a perspective view showing the construction of a semiconductor apparatus (liquid crystal display) (embodiment 4).

In this embodiment, examples of liquid crystal displays manufactured according to the invention are shown in FIG. 5. The method of manufacturing the pixel TFT (pixel switching element) and the cell assembly process may use the known means, and thus their detailed explanations will be omitted.

In FIG. 5, reference number 500 denotes a substrate (a plastic substrate with an oxide silicon film) having an insulating surface, 501 a pixel matrix circuit, 502 a scan line drive circuit, 503 a signal line drive circuit, 530 a counter substrate, 510 an FPC (flexible printed circuit), and 520 a logic circuit. The logic circuit 520 may include such circuits as D/A converter, γ correction circuit and signal dividing circuit, which perform processing that has conventionally been performed by IC. It is of course possible to provide an IC chip on the substrate to perform signal processing.

Further, although this embodiment takes up a liquid crystal display as an example, the invention can also be used in electroluminescence display and electrochromic display as long as they are of active matrix type.

The liquid crystal display manufactured by this invention can be of transmission type or reflection type, either of which can be chosen. In this way, this invention is used in any kind of active matrix electrooptical apparatus (semiconductor apparatus).

The manufacture of the semiconductor apparatus shown in this embodiment may employ any of the configurations of embodiment 1 to embodiment 3, and any combination of these may also be used.

Embodiment 5

This invention can be used in the conventional IC technologies in general, i.e., in all semiconductor circuits currently available in the market. For example, the invention may be used in a RISC processor integrated on a single chip, a microprocessor such as ASIC processor, a signal processing circuit represented by liquid crystal driver circuit (D/A converter, γ correction circuit, signal dividing circuit, etc.), or a high frequency circuit for portable devices (cellular phone, PHS, mobile computer, etc.).

The semiconductor circuits such as microprocessors are mounted on various electronic apparatus and function as a central circuit. Typical electronic apparatus include personal computers, portable type information terminals, and a variety of kinds of electric equipments. They also include vehicle (automobiles and railroad cars) control computers. This invention is also used in such semiconductor apparatus.

The manufacture of the semiconductor apparatus shown in this embodiment may employ any of the configurations of embodiment 1 to embodiment 3, and any combination of these may also be used.

Embodiment 6

TFT manufactured according to this invention can be used in a variety of electrooptical apparatus. That is, this invention can be implemented in all electronic equipment incorporating the electrooptical apparatus as display means.

Such electronic equipment include video camera, digital camera, head-mounted display (goggle type display), wearable display, car navigator, personal computer, portable information terminal (mobile computer, cellular phone, electronic book, etc.). Some of these examples are shown in FIGS. 6A to 6F and FIGS. 17A to 17B.

Figure 6A:
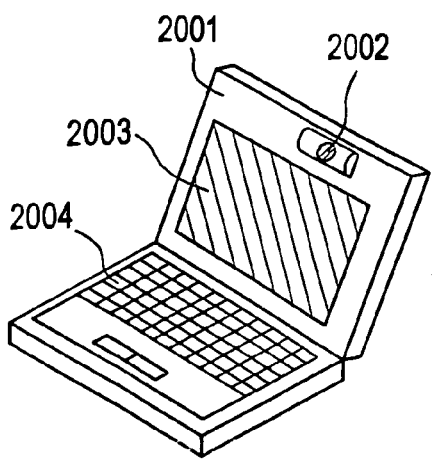
FIGS. 6A to 6F show examples of semiconductor apparatuses (electronic apparatuses) (embodiment 6).

FIG. 6A shows a personal computer, which includes a body 2001, an image input section 2002, a display 2003, and a keyboard 2004. This invention can be used in the image input section 2002, display 2003 and other signal drive circuits.

Figure 6B:
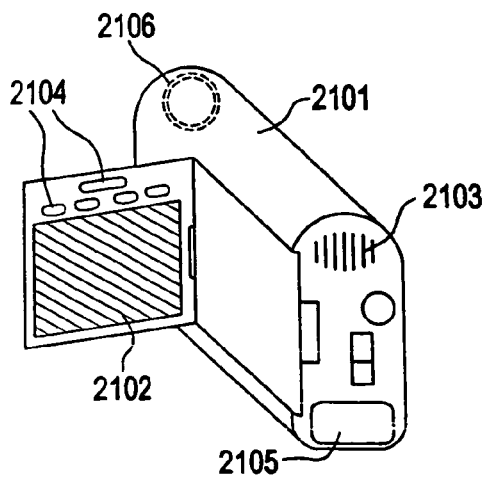

FIG. 6B shows a video camera, which comprises a body 2101, a display 2102, a voice input section 2103, operation switches 2104, a battery 2105, and a image receiving section 2106. This invention can be used in the display 2102, voice input section 2103 and other signal drive circuit.

Figure 6C:
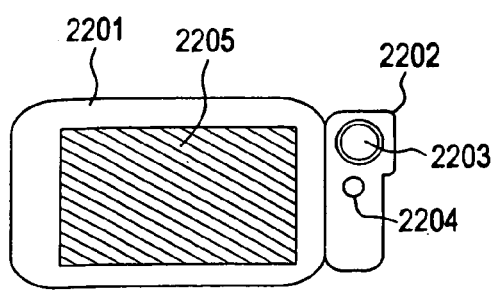

FIG. 6C shows a mobile computer, which comprises a body 2201, a camera section 2202, an image receiving section 2203, an operation switch 2204, and a display 2205. This invention can be used in the display 2205 and other signal drive circuits.

Figure 6D:
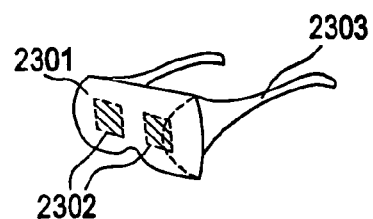

FIG. 6D shows a goggle type display, which comprises a body 2301, a display 2302 and an arm section 2303. This invention can be used in the display 2302 and other signal drive circuits.

Figure 6E:
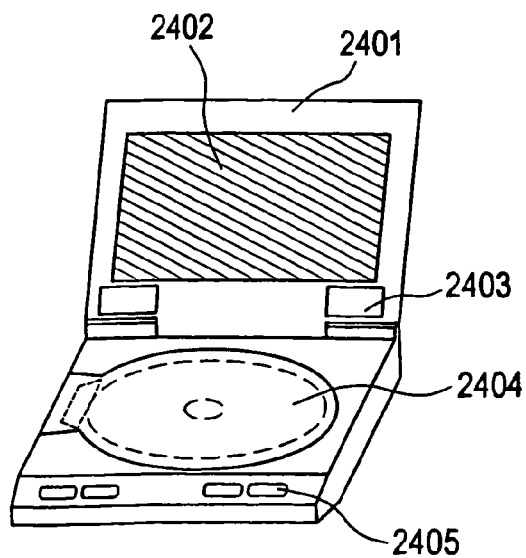

FIG. 6E shows a player using a recording medium in which a program is stored, comprising a body 2401, a display 2402, a speaker 2403, recording medium 2404 and operation switches 2405. This apparatus uses DVD (digital versatile disc) and CD as a recording medium and can be used for playing music, movie and game and for accessing the Internet. This invention can be used in the display 2402 and other signal drive circuits.

Figure 6F:
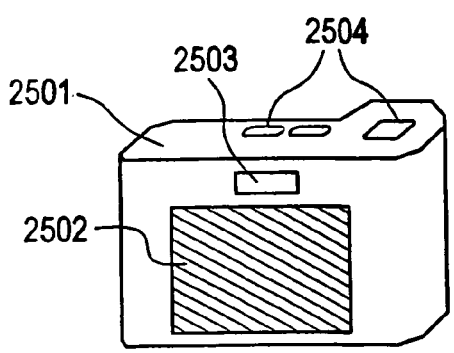

FIG. 6F shows a digital camera, which comprises a body 2501, a display 2502, an eye piece section 2503, operation switches 2504, and an image receiving section (not shown). This invention can be used in the display 2502 and other signal drive circuits.

Figure 17A:
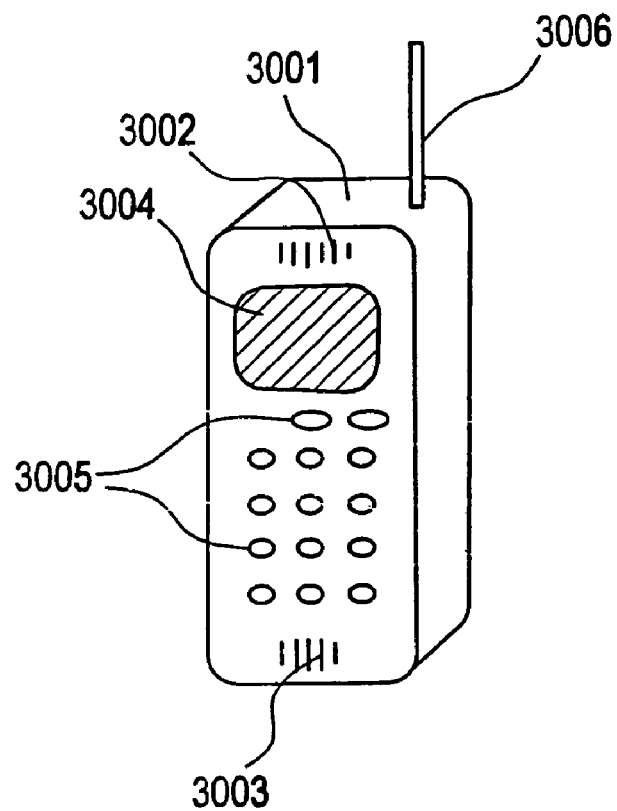
FIGS. 17A and 17B show examples of semiconductor apparatuses.

FIG. 17A shows a cellular phone, which comprises a body 3001, an audio output section 3002, an audio input section 3003, a display 3004, operation switches 3005 and an antenna 3006.

Figure 17B:
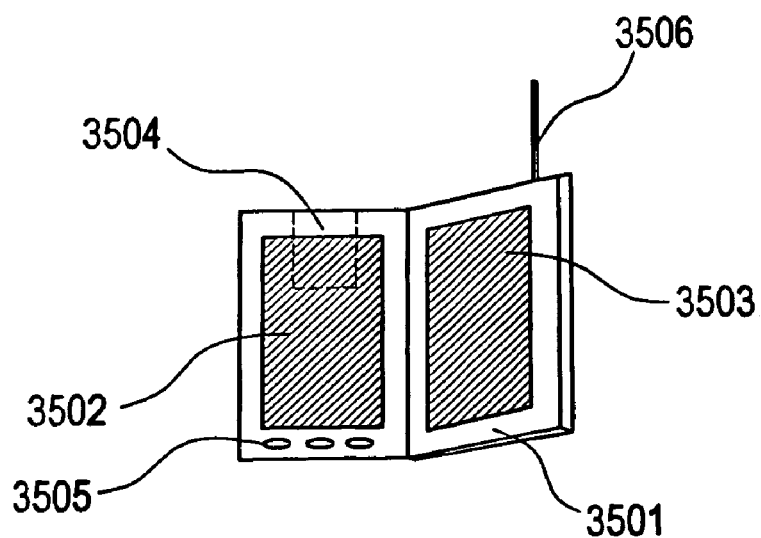

FIG. 17B shows an electronic book, which comprises a body 3501, displays 3502, 3503, a recording medium 3504, operation switches 3505 and an antenna 3506.

As described above, the range of use of this invention is very wide so that electronic apparatus in any field can be used. The electronic apparatus of this embodiment can be realized by any combination of embodiment 1 to embodiment 5.

Embodiment 7

TFT formed according to this invention can be used in a variety of electrooptical apparatus. That is, this invention can be implemented in all electronic apparatus incorporating the electrooptical apparatus as display means.

Such electronic apparatus include a projector (rear or front type). Some examples are shown in FIG. 16.

Figure 16A:
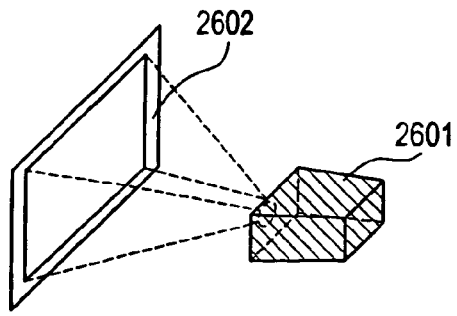
FIGS. 16A to 16D show examples of semiconductor apparatuses (electronic apparatuses) (embodiment 7).

FIG. 16A shows a front type projector, which comprises a display 2601 and a screen 2602. This invention can be used in the display and other signal drive circuits.

Figure 16B:
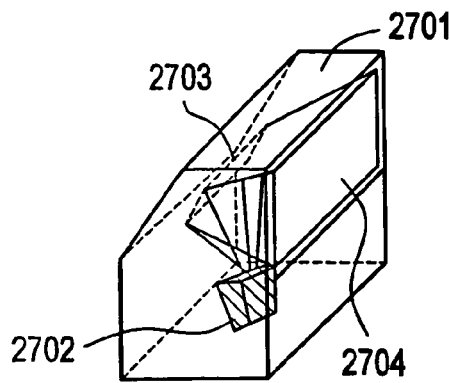

FIG. 16B shows a rear type projector, which comprises a body 2701, a display 2702, a mirror 2703, and a screen 2704. This invention can be used in the display and other signal drive circuits.

Figure 16C:
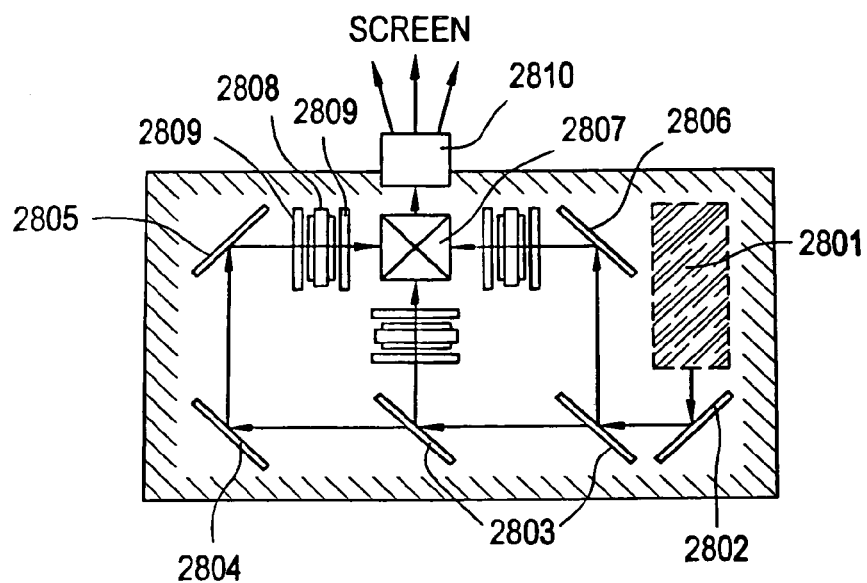

FIG. 16C shows an example structure of the displays 2601, 2702 of FIGS. 16A and 16B. The displays 2601, 2702 comprise a light source optical system 2801, mirrors 2802, 2804–2806, a dichroic mirror 2803, a prism 2807, a liquid crystal display 2808, a phase plate 2809, and a projection optical system 2810. The projection optical system 2810 is an optical system including a projection lens. Although this embodiment shows an example of three plate type, a single plate type may also be used. In FIG. 16C, it is possible to provide on light paths indicated by arrows an optical system including an optical lens, a film having a polarizing function, a film for adjusting the phase difference and an IR film.

Figure 16D:
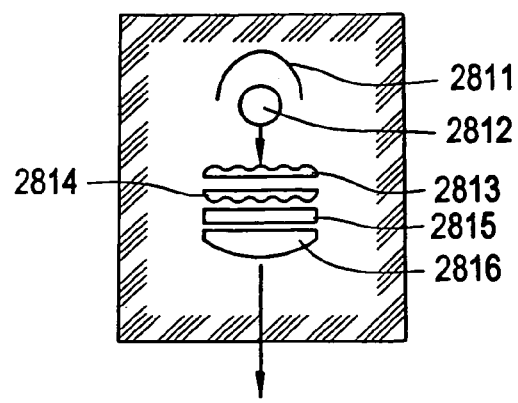

FIG. 16D shows an example structure of the light source optical system 2801 of FIG. 16C. In this embodiment, the light source optical system 2801 includes a reflector 2811, a light source 2812, 2813, 2814, a polarized light conversion element 2815, and a focusing lens 2816. The light source optical system shown in FIG. 16D is only one example. It is also possible to provide in the light source optical system an optical system including an optical lens, a film having a polarizing function, a film for adjusting phase difference and an IR film.

As described above, the range of use of this invention is very wide so that the invention can be used in electronic equipment in any field. The electronic equipment of this embodiment can be realized by any combination of the embodiment 1 to embodiment 5. It is noted, however, that the projector of this embodiment is a transmission type liquid crystal display and cannot be used with the reflection type liquid crystal display.

Implementing this invention can improve the reproducibility and stability of the TFT and also its productivity.

This invention can realize TFTs that exhibit very good electrical characteristics, by forming over a heat-treated first insulating film a second insulating film and a semiconductor film successively in laminated structure without exposing them to the atmosphere. In particular, the invention can realize the threshold voltage Vth, a representative parameter of the TFT, in a range of −0.5 to 2 V for N-channel TFT and 0.5 to −2 V for P-channel TFT.

Further, if the second insulating film has a thickness of 20 nm or more, the Vth can be suppressed to within about ±0.2 V for the thickness variation of ±10 nm, thus producing TFTs with uniform characteristics and small variations.

Further, the threshold voltage variation ΔVth, one of the parameters representing the reliability of TFT, can also be reduced to enhance the reliability of TFT.

The subthreshold factor (S value), a representative parameter of TFT, can realize 0.1–0.3 V/decade.

What is claimed is:

1. A semiconductor device comprising;
a substrate;
a first insulating film provided over said substrate;
a second insulating film provided over said first insulating film;
a semiconductor film provided over said second insulating film;
a channel region provided in said semiconductor film; and
a gate electrode provided over said channel region with a gate insulating film therebetween,
wherein concentration of boron in an interface between said first insulating film and said second insulating film is higher than concentration of boron in an interface between said second insulating film anti said channel region.

2. A semiconductor device according to claim 1 wherein said semiconductor device is incorporated into one selected from the group consisting of a personal computer, a video camera, a mobile computer, a goggle type display, a player using a recording medium, a digital camera, a cellular phone, and an electronic book.

3. A semiconductor device according to claim 1 wherein said semiconductor film comprises a material selected from the group consisting of silicon, germanium and $Si_xGe_{1-x}$ where 0<x<1.

4. A semiconductor device according to claim 1 wherein said semiconductor film comprises a crystalline semiconductor film.

5. A semiconductor device according to claim 1 wherein said substrate is selected from the group consisting of an insulating substrate, a ceramic substrate, a stainless steel substrate, a metal substrate, a semiconductor substrate and a plastic substrate.

6. A semiconductor device according to claim 1 wherein said gate insulating film comprises an organic resin having benzocyclobutene (BCB).

7. A semiconductor device according to claim 1 wherein said second insulating film comprises a material selected from the group consisting of silicon nitride, silicon oxynitride and silicon oxide.

8. A semiconductor device according to claim 1 wherein said first insulating film comprises a material selected from the group consisting of silicon nitride, silicon oxynitride and silicon oxide.

9. A semiconductor device according to claim 1 wherein said first insulating film has a film thickness of from 100 to 500 nm.

10. A semiconductor device according to claim 1 wherein said second insulating film has a film thickness of from 10 to 100 nm.

11. A semiconductor device according to claim 1, wherein the concentration of boron in an interface between said first insulating film and said second insulating film is $3\times10^{17}$ atoms/cm$^3$ at maximum.

12. A semiconductor device comprising:
a substrate;
a first insulating film provided over said substrate;
a second insulating film provided over said first insulating film;
a semiconductor film provided over said second insulating film;
a source region and a drain region provided in said semiconductor film;
a channel region provided in said semiconductor film between said source region and said drain region; and
a gate electrode provided over said channel region with a gate insulating film therebetween,
wherein concentration of boron in an interface between said first insulating film and said second insulating film is higher than concentration of boron in an interface between said second insulating film and said channel region.

13. A semiconductor device according to claim 12 wherein said semiconductor device is incorporated into one selected from the group consisting of a personal computer, a video camera, a mobile computer, a goggle type display, a player using a recording medium, a digital camera, a cellular phone, and an electronic book.

14. A semiconductor device according to claim 12 wherein said semiconductor film comprises a material selected from the group consisting of silicon, germanium and $Si_xGe_{1-x}$ where 0<x<1.

15. A semiconductor device according to claim 12 wherein said semiconductor film comprises a crystalline semiconductor film.

16. A semiconductor device according to claim 12 wherein said substrate is selected from the group consisting of an insulating substrate, a ceramic substrate, a stainless steel substrate, a metal substrate, a semiconductor substrate and a plastic substrate.

17. A semiconductor device according to claim 12 wherein said gate insulating film comprises an organic resin having benzocyclobutene (BCB).

18. A semiconductor device according to claim 12 wherein said second insulating film comprises a material selected from the group consisting of silicon nitride, silicon oxynitride and silicon oxide.

19. A semiconductor device according to claim 12 wherein said first insulating film comprises a material selected from the group consisting of silicon nitride, silicon oxynitride and silicon oxide.

20. A semiconductor device according to claim 12 wherein said first insulating film has a film thickness of from 100 to 500 nm.

21. A semiconductor device according to claim 12 wherein said second insulating film has a film thickness of from 10 to 100 nm.

22. A semiconductor device according to claim 12, wherein the concentration of boron in an interface between said first insulating film and said second insulating film is $3\times10^{17}$ atoms/cm$^3$ at maximum.

23. A semiconductor device comprising:
a substrate;
a first insulating film provided over said substrate;
a second insulating film provided over said first insulating film;
a semiconductor film provided over said second insulating film;
a channel region provided in said semiconductor film; and
a gate electrode provided over said channel region with a gate insulating film therebetween, wherein concentration of boron in an interface between said first insulating film and said second insulating film is higher than concentration of boron in an interface between said second insulating film and said channel region, and wherein said second insulating film is thinner than said first insulating film.

24. A semiconductor device according to claim 23 wherein said semiconductor device is incorporated into one selected from the group consisting of a personal computer, a video camera, a mobile computer, a goggle type display, a player using a recording medium, a digital camera, a cellular phone, and an electronic book.

25. A semiconductor device according to claim 23 wherein said semiconductor film comprises material selected from the group consisting of silicon, germanium and $Si_xGe_{1-x}$ where $0<x<1$.

26. A semiconductor device according to claim 23 wherein said semiconductor film comprises a crystalline semiconductor film.

27. A semiconductor device according to claim 23 wherein said substrate is selected from the group consisting of an insulating substrate, a ceramic substrate, a stainless steel substrate, a metal substrate, a semiconductor substrate and a plastic substrate.

28. A semiconductor device according to claim 23 wherein said gate insulating film comprises an organic resin having benzocyclobutene (BCB).

29. A semiconductor device according to claim 23 wherein said second insulating film comprises a material selected from the group consisting of silicon nitride, silicon oxynitride and silicon oxide.

30. A semiconductor device according to claim 23 wherein said first insulating film comprises a material selected from the group consisting of silicon nitride, silicon oxynitride and silicon oxide.

31. A semiconductor device according to claim 23 wherein said first insulating film has a film thickness of from 100 to 500 nm.

32. A semiconductor device according to claim 23 wherein said second insulating film has a film thickness of from 10 to 100 nm.

33. A semiconductor device according to claim 23, wherein the concentration of boron in an interface between said first insulating film and said second insulating film is $3\times10^{17}$ atoms/cm³ at maximum.

* * * * *